US006576147B2

(12) United States Patent
Mukai

(10) Patent No.: US 6,576,147 B2
(45) Date of Patent: Jun. 10, 2003

(54) METHOD OF LAYOUT COMPACTION

(75) Inventor: Kiyohito Mukai, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/263,647

(22) Filed: Oct. 4, 2002

(65) Prior Publication Data
US 2003/0033581 A1 Feb. 13, 2003

Related U.S. Application Data

(63) Continuation of application No. 09/822,482, filed on Apr. 2, 2001, now Pat. No. 6,473,882.

(30) Foreign Application Priority Data

Apr. 14, 2000 (JP) ........................................ 2000-113512

(51) Int. Cl.[7] .............................................. G06F 17/50
(52) U.S. Cl. .............................................. 216/2; 716/19
(58) Field of Search .................................. 716/2, 19–21

(56) References Cited

U.S. PATENT DOCUMENTS

| 5,208,124 A | 5/1993 | Sporon-Fiedler et al. ...... 430/5 |
| 5,612,893 A | 3/1997 | Hao et al. .................. 364/491 |
| 5,974,244 A | 10/1999 | Hayashi et al. ......... 395/500.09 |
| 6,035,108 A | 3/2000 | Kikuchi ................. 395/500.03 |
| 6,038,020 A | 3/2000 | Tsukuda ................... 356/237.5 |
| 6,187,483 B1 | 2/2001 | Capodieci et al. ............. 430/5 |
| 6,457,157 B1 * | 9/2002 | Singh et al. ................... 716/2 |

FOREIGN PATENT DOCUMENTS

JP  580486  4/1993

* cited by examiner

Primary Examiner—Tuan T. Lam
Assistant Examiner—Quan Tra
(74) Attorney, Agent, or Firm—Stevens, Davis, Miller & Mosher, LLP

(57) ABSTRACT

It is an object of the invention to carry out layout compaction in which optical proximity effect is taken account of the irregularly disposed layout patterns also contained within circuit design data to increase the degree of integration of the semiconductor integrated circuit devices. A compaction control step generates a compaction condition; an optical proximity correction condition generation step generates an optical proximity correction information; a layout compaction step compacts an input layout pattern; an optical proximity correction step corrects an optical proximity effect: a corrected layout pattern retention step retains an optical proximity corrected layout pattern; a verification step verifies circuit operation on compacted and optical proximity corrected layout patterns; an error data retention step retains a layout pattern having any problem; the compaction control step generates a compaction condition again in which optical proximity effect and error data are taken account of; and the above-mentioned steps are repeated.

7 Claims, 28 Drawing Sheets

F I G. 1
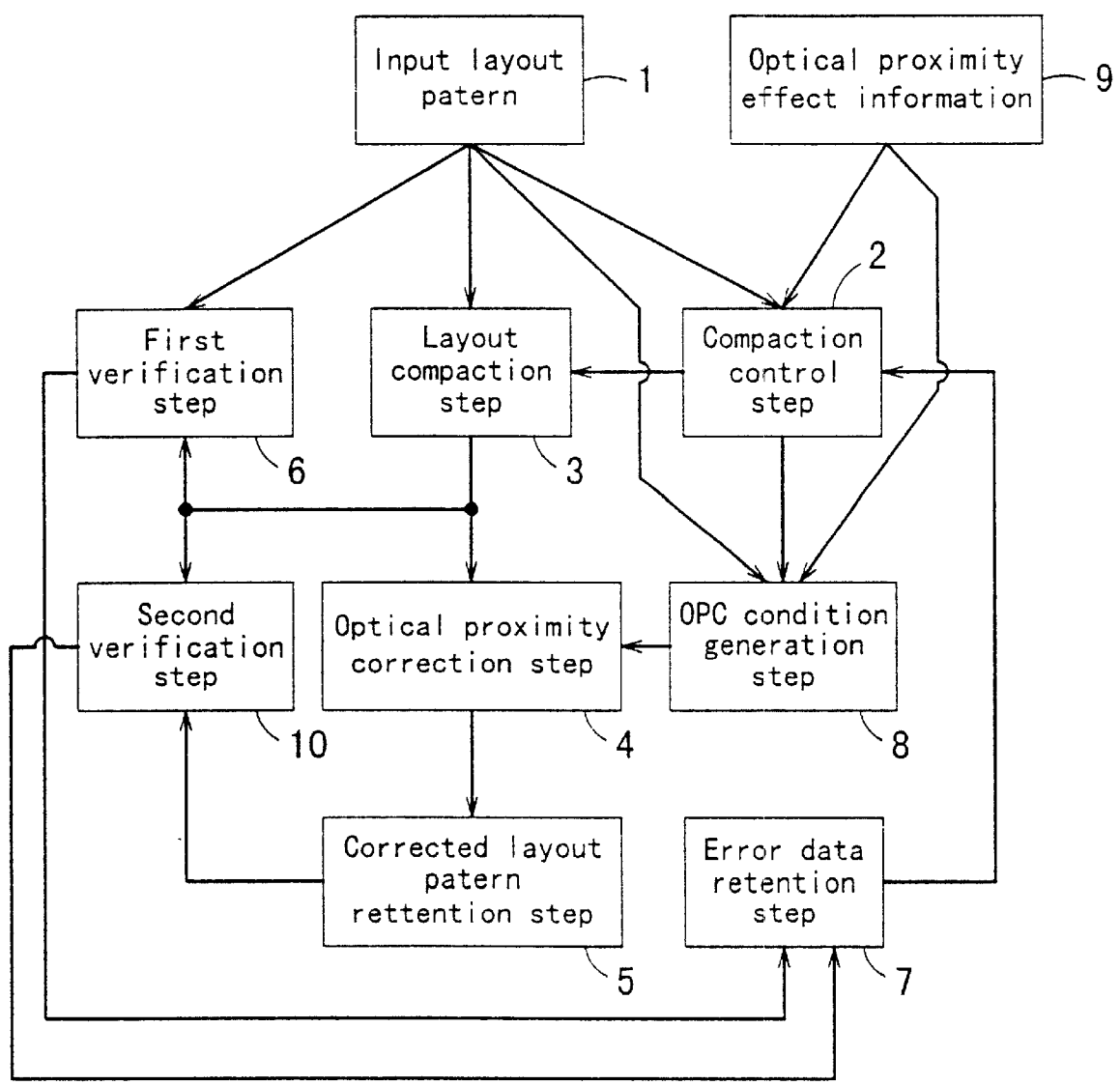

Design layout

METHOD OF LAYOUT COMPACTION

This is a continuation application of Ser. No. 09/822,482 filed Apr. 2, 2001 now U.S. Pat. No. 6,473,882.

BACKGROUND OF THE INVENTION

1. Field of the Invention

The present invention relates to a method of layout compaction for increasing degree of integration in a semiconductor integrated circuit. This method includes a correction method of mask pattern for modifying in advance a semiconductor mask pattern used for manufacturing semiconductor integrated circuits so that a transfer image close to a desired design pattern can be obtained.

2. Description of the Related Art

Recently, the circuit scale has been increased due to a tendency of multi-functionalization in a semiconductor integrated circuit, accompanying this, the area of a semiconductor integrated circuit has also been increased in proportion to the circuit scale. Whereas, recently, in order to control the manufacturing cost at a low level, restriction of the area to increase is in now rapidly in progress. Further, in order to obtain a high-speed operation, segmentalization in manufacturing process is promptly in progress. To restrict increase of the area as well as to realize a segmentalization in manufacturing process taking account of a required circuit scale and circuit area, it is indispensable to increase the degree of integration at the stage of designing as well as to provide a minute pattern close to the limit of manufacturing ability. Furthermore, when an integrated circuit is manufactured close to the limit of manufacturing ability, an optical proximity effect will appear remarkably.

For a producible layout pattern which is a repetition of an identical pattern or a two-dimensional layout of an identical patter, in order to make the area small, it is indispensable a layout in which the optical proximity effect is taken account of. As for items that have such a layout pattern, a static random access memory, what is called SRAM and a dynamic random access memory, what is call DRAM are typical. In layout in which an identical pattern is disposed repeatedly in all directions such as a SRAM or DRAM, the layout, in which the optical proximity effect is taken account of, can be designed relatively easily.

In this case, it is not always designed with a layout pattern conforming to a process standard but there are many cases where a layout pattern is designed in a dimension smaller than an ordinary process standard.

Whereas, a layout pattern for a circuit that carries out logical operation is designed with a different layout pattern according to respective function. Further, there may be a case where layout patterns disposed on the periphery are different from each other depending on the functions to be provided. Consequently, combinations of them become huge in number. Accordingly, in general, a layout, in which the optical proximity effect is taken account of, is carried out with optical proximity correction by means of a computer-aided design, what is called CAD. An example of the optical proximity correction is disclosed, for example, in Japanese Patent Laid-Open No. 80486/1993. The optical proximity correction is sometimes called OPC for short.

Further, layout compaction also is also carried out by means of the computer-aided design. FIG. 18 shows a flow of a conventional case where, a layout data of an existing semiconductor integrated circuit is compacted and is converted into a mask pattern.

First of all, a compaction process of a layout data is carried out on the layout data file 11 at the compaction step 12. The compacted layout data is stored in the layout data file 13. The compaction process is to compact spaces among polygonal figures contained in a layout data, in some cases, the width of the pattern is also compacted to compact the area of a semiconductor integrated circuit.

In the verification step 14, the layout data contained in the layout data file 13 is verified whether or not the same conforms to a process standard. Further, in the verification step 14, it is confirmed whether or not the layout data contained in the layout file 13 is in a conjunction relationship identical as the layout data contained in the layout data file 11. Still further, in the verification step 14, a simulation of transistor operation is made to confirm whether or not the circuit operates normally.

In case where the result of the simulation is not correct, the layout data contained in the layout data file 11 is corrected, or the condition of the compaction process executed in the compaction step 12, and the compaction process is carried out again. In case where the result of the simulation is correct, the layout data file 13 is transferred to the optical proximity correction step 15. In the optical proximity correction step 15, after carrying out OPC process appropriate for manufacturing the semiconductor integrated circuit, a mask layout data is generated and is stored in the mask layout data file 16. The compaction standard for this case is limited to a process standard.

However, in a large-scale semiconductor integrated circuit, not only a repetition of an identical pattern exists such as a SRAM and DRAM, but also a random logic circuit also exists; this random logic circuit will become large in size. Due to this reason, in designing of a semiconductor integrated circuit, it is impossible actually to carry out a layout, in which the optical proximity effect is taken account of, in advance, on respective circuit layouts.

Further, carrying out a layout in which the optical proximity effect is taken account of means that the layout has to be modified when a manufacturing condition of the semiconductor integrated circuit is changed resulting in a layout design poor in production efficiency.

SUMMARY OF THE INVENTION

It is an object of the present invention to carry out layout compaction in which optical proximity effect is taken account of relative to irregularly disposed layout patterns contained within design data of semiconductor integrated circuits. More particularly, it is an object of the invention to provide a method of layout compaction that is capable of increasing the degree of integration of the semiconductor integrated circuit devices.

It is another object of the invention to provide a method of layout compaction that is capable of generating compaction conditions for carrying out a layout compaction process optimized to a manufacturing condition of a semiconductor integrated circuit.

It is still another object of the invention to provide a method of layout compaction that is capable of verifying whether or not any difference is caused in electrical characteristic resulting in a failure in the operation of the semiconductor integrated circuit by carrying out comparison between the result of a layout compaction and the data before the compaction is carried out.

The method of layout compaction according to the invention includes a compaction control step, an optical proximity correction condition generation step (hereinafter, referred to as OPC condition step), a layout compaction step, a first verification step, an optical proximity correction step and a second verification step.

In the compaction control step, a compaction condition appropriate to an input layout pattern is generated.

In the OPC condition generation step, an optical proximity correction condition in which the compaction condition is taken account of generated by the compaction control step.

In the layout compaction step, a compacted layout pattern is generated by carrying out a compaction of the input layout pattern in accordance with the compaction condition.

In the first verification step, the input layout pattern and the compacted layout pattern are received as data and a comparison is made between the input layout pattern and the compacted layout pattern to verify that the compacted layout pattern performs circuit operation properly. In case where any problem is found, a first error data is outputted.

In the optical proximity correction step, an optical proximity effect is corrected in accordance with an optical proximity correction condition relative to the compacted layout pattern, and an optical proximity corrected layout pattern is generated.

In the second verification step, the compacted layout pattern and the optical proximity corrected layout pattern are received as data and a finish pattern to be formed on a wafer the optical proximity corrected layout pattern is obtained. A comparison is made between the compacted layout pattern and the finish pattern to verify that the optical proximity corrected layout pattern is formed properly. In case where any problem is found, a second error data is outputted.

Thus, a generation of a compaction condition for the compaction control step is controlled based on the first error data and the second error data.

According to the above-mentioned method, a compaction of a layout pattern can be carried out under a condition where influence of the optical proximity effect is taken account of and the area thereof can be made smaller than a compaction condition limited to a process standard. Further, since the compaction is carried out while carrying out comparison and verification of an electrical characteristic between the initial input layout pattern and the compacted layout pattern using a simulation, hardly a large difference occurs between the electrical characteristic of the initial layout pattern and the electrical characteristic after carrying out the layout compaction. As a result, a circuit structure that shows a desired electrical characteristic can be realized with a layout pattern with a smaller area.

Further, according to the above-mentioned method, a finish pattern to be formed on a wafer by the optical proximity corrected layout pattern is obtained by means of a simulation. The compaction is carried out while carrying out a comparison between the compacted layout pattern and the finish pattern and carrying out verification that the optical proximity corrected layout pattern is formed properly. As a result, it is made possible to generate a compaction condition for carrying out a layout compaction optimized to a manufacturing condition of a semiconductor integrated circuit device. Furthermore, it is made possible to verify whether or not the optical proximity corrected layout pattern is formed properly.

In the above-mentioned method of layout compaction of the invention, the compaction control step includes, for example, a minimum layout condition extraction step, a basic pattern extraction step, and a compaction condition extraction step.

In the minimum layout condition extraction step, a producible minimum layout condition is extracted based on optical proximity effect information.

In the basic pattern extraction step, the input layout pattern is resolved into a plurality of basic patterns.

In the compaction condition extraction step, a compaction condition is generated based on the minimum layout condition extracted by the minimum layout condition extraction step and the plurality of basic patterns extracted by the basic pattern extraction step.

According to the above-mentioned method, a compaction condition taking account of the optical extraction effect can be generated by extracting a minimum layout condition from the optical proximity effect information, calculating minimum dimension of a producible layout pattern based on the minimum layout condition and setting the lower limit of the compaction. Further, by resolving the layout pattern to be compacted into a plurality of basic patterns, respective compaction condition can be set to each basic pattern and a high effective compaction can be realized.

In the above-mentioned method of layout compaction of the invention, the first verification step includes, for example, a pattern comparison step, a delay conversion step and a delay verification step.

In the pattern comparison step, a differential pattern between the input layout pattern and the compacted layout pattern is extracted.

In the delay conversion step, a capacitor capacity is calculated based on the extracted differential pattern extracted in the pattern comparison step, and the capacitor capacity is converted into a delay value.

In the delay verification step, verification for any operational problem due to a delay variation is carried out based on the delay value calculated by the delay conversion step.

According to the above-mentioned method, by calculating a capacitor capacity based on the differential pattern, converting the capacitor capacity into a delay value and comparing with a limit condition of the delay value indicating a limitation where no influence is given to the circuit operation due to a delay, it is made possible to carry out a high speed verification of circuit operation. Accordingly, it is not necessary to carry out verification of operation by extracting a parasitic capacity from the compacted layout pattern and carrying out a simulation.

In the above-mentioned method of layout compaction according to the invention, the compaction control step includes, for example, a capacity conversion step, a pattern conversion step and a compaction condition extraction step.

In the capacity conversion step, an allowable value of delay time variation in the input layout pattern is converted into a capacitor capacity variation allowable value.

In the pattern conversion step, the capacitor capacity variation allowable value is converted into a layout variation allowable pattern.

In the compaction condition extraction step, a conversion condition is generated based on the layout variation allowable pattern obtained in the pattern conversion step.

According to the above-mentioned method, while directing the viewpoint to a variation of delay time in electrical circuit, by converting the variation range of delay time wherein operation of the electrical circuit is ensured into a capacitor capacity and by converting the variation range of capacitor capacity into a differential pattern in the layout pattern, amount of the pattern variation due to the compaction can be determined. In this manner, since a compaction condition can be set, a high efficient compaction can be provided.

In the above-mentioned method of layout compaction, the compaction control step includes, for example, a minimum layout condition extraction step, a basic pattern extraction step, a first compaction condition extraction step, a capacity conversion step, a pattern conversion step a second compaction condition extraction step and a compaction condition selection step.

In the minimum layout condition extraction step, a producible minimum layout condition is extracted based on an optical proximity effect information.

In the basic pattern extraction, the input layout pattern is resolved into a plurality of basic patterns.

In the first compaction condition extraction step, a first compaction condition candidate is generated based on the minimum layout condition extracted in the minimum layout condition extraction step and the plurality of basic patterns extracted in the basic pattern extraction step.

In the capacity conversion step, a delay time variation allowable value in the input layout pattern is converted into a capacitor capacity variation allowable value.

In the pattern conversion step, the capacitor capacity variation allowable value is converted into a layout variation allowable pattern.

In the second compaction extraction step, a second compaction candidate is generated based on the layout variation allowable pattern obtained in the pattern conversion step.

In the compaction selection step, a easier compaction condition is selected out of the first compaction candidate obtained in the first compaction condition extraction step and the second compaction condition candidate obtained in the second compaction extraction step.

According to the above-mentioned method, by selecting second compaction condition out of the first and second compaction condition candidates, it is made possible to set a condition producible and ensuring proper operation of the electrical circuit. According, it is made possible to reduce the processing time for the entire layout compaction.

In the above-mentioned method of layout compaction of the invention, it is characterized that the compaction control step outputs, for example, a data of the width of the layout pattern and a data of the space between the layout pattern and the neighboring another layout pattern in a pair as a compaction condition.

In the above-mentioned method of layout compaction according to the invention, it is preferable that the compaction condition is altered depending on the results of the first and second verification steps.

BRIEF DESCRIPTION OF THE DRAWING

FIG. 1 is a block diagram showing a schematic structure of the method of layout compaction according to a first embodiment of the present invention;

DESCRIPTION OF THE PREFERRED EMBODIMENTS

First Embodiment

Figure 2:
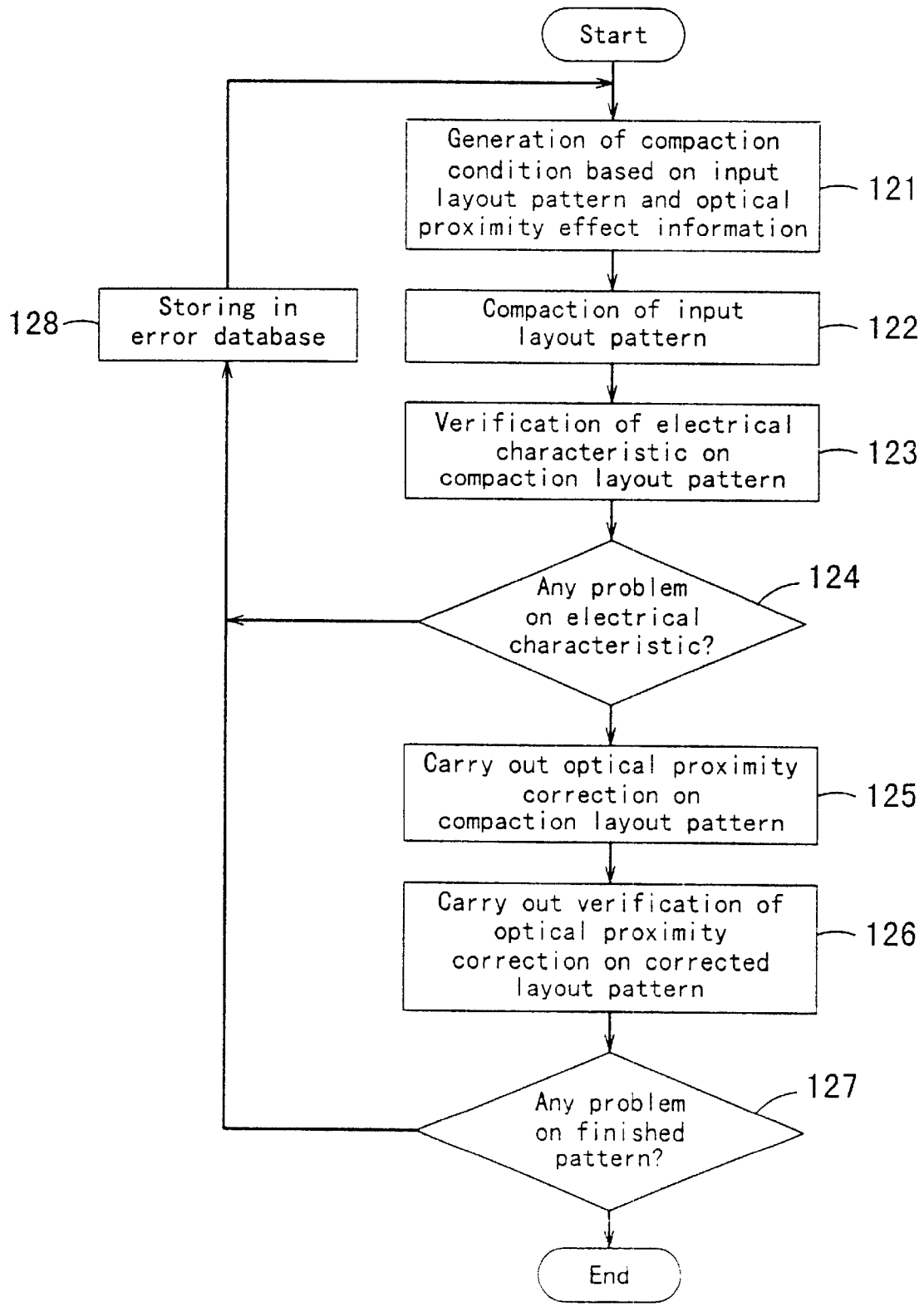
FIG. 2 is a flowchart showing the processing steps of the method of layout compaction.

Hereinafter, referring to the drawings, a description will be made about the embodiments of the present invention. FIG. 1 is a block diagram showing a schematic structure of the method of layout compaction according to an embodiment of the invention. The method of layout compaction is comprised of an input layout pattern 1, a compaction control step 2, a layout compaction step 3, a optical proximity correction step 4, a corrected layout pattern retention step 5, a first verification step 6, a error data retention step 7, a OPC condition generation step 8, optical proximity effect information 9 and a second verification step 10.

First of all, a layout pattern of a semiconductor integrated circuit comprised of a plurality of rectangular patterns is set as the input layout pattern 1.

In the compaction control step 2, a compaction lower limit value is calculated based on the optical proximity effect information 9 and a data retained in the error data retention step 7, and a compaction condition is generated based on the compaction lower limit and the layout pattern and retained.

Herein, a description will be made about the optical proximity effect information 9, the data retained in the error data retention step 7, the compaction lower limit value and the compaction value.

Figure 19A:
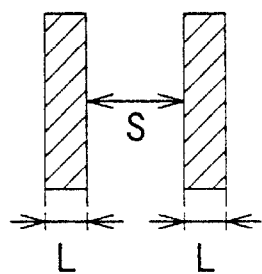
FIG. 19A is an illustration showing a layout pattern.
Figure 19B:
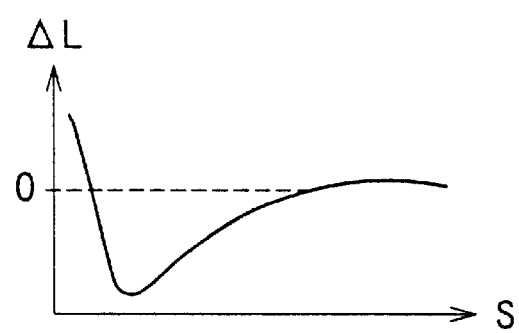
FIG. 19B is a graph showing a relationship between a space in a layout pattern and dispersion of the pattern on a wafer.
Figure 19C:
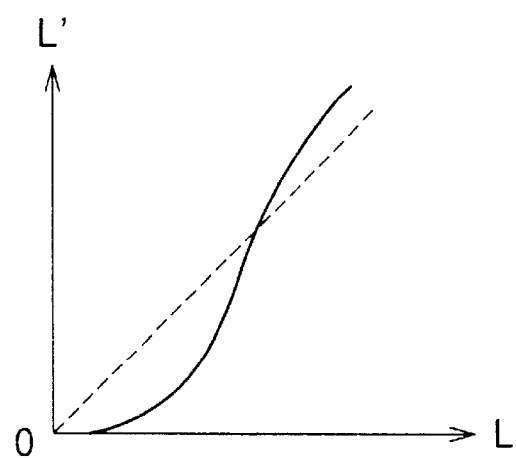
FIG. 19C is a graph showing a relationship between the width of a layout pattern and the width of the pattern on a wafer.

When two rectangular patterns having a pattern width L respectively disposed parallel with each other with a space S between them are formed on a wafer as shown in FIG. 19A, a dispersion is made in the dimension of the formed pattern depending on the pattern width L and the space S between the patterns. FIG. 19B is a graph showing a relationship between the space S between the pattern and the dispersion ΔL of the pattern width on a wafer. FIG. 19C is a graph showing a relationship between the pattern width L of a layout pattern and the pattern width L on a wafer.

For example, in case where the space S between the patterns is extremely small, the pattern width on the wafer becomes larger due to an optical proximity effect. That is to say, on the graph in FIG. 19B, when the space S between the patterns is small, the dispersion ΔL of the pattern width becomes larger. Information of this dispersion in dimension is called as optical proximity effect information 9.

Figure 20:
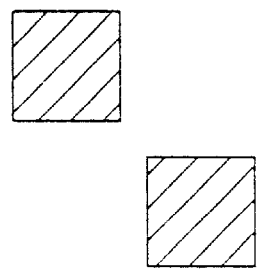
FIG. 20 is an illustration showing an error pattern.

Next, a description will be given about the data retained in the error data retention step 7. The above-mentioned optical proximity effect information 9 is for a case where two rectangular patterns are disposed parallel with each other; it is quite different from the actual patterns. For example, in case of the patterns as show in FIG. 20, when the optical proximity effect information 9 is applied thereto and an optical proximity correction is made, on the wafer, any proper correction to obtain the pattern shown in FIG. 20 is not carried out. It can be verified in the first verification step and the second verification step. Thus, the pattern that is not correct properly and the location thereof are retained as an error data.

Figure 21:
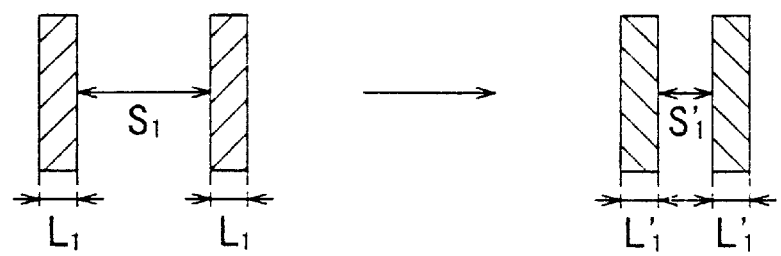
FIG. 21 is an illustration for illustrating a lower limit value of compaction in a basic pattern.
Figure 22:
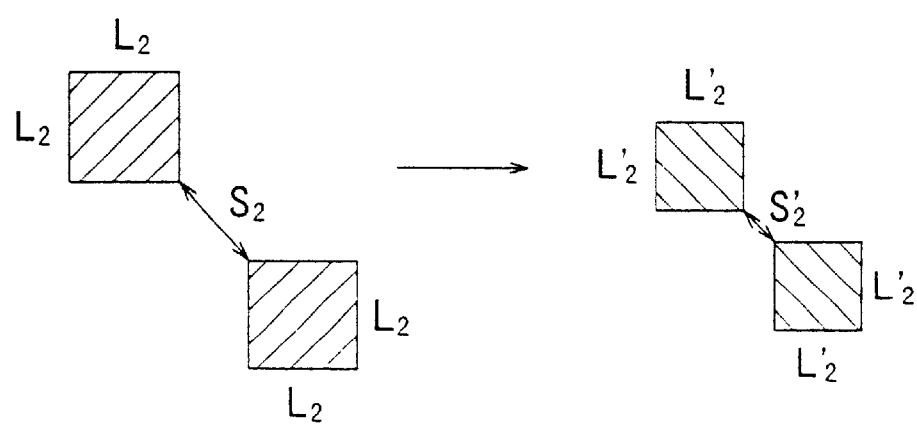
FIG. 22 is an illustration for illustrating a lower limit value of compaction in an error pattern.

Next, the compaction lower limit value means a limit value wherein a basic pattern with width $L_1$ and space $S_1$ shown in FIG. 21 and a pattern of error data with width $L_2$ and space $S_2$ shown in FIG. 22 can be compacted normally respectively. The values are, in the basic pattern, pattern width: $L_1'$, space between the patterns: $S_1'$. Whereas, in the error data pattern, pattern width: $L_2'$, space between the patterns: $S_2'$.

And, the compaction condition is obtained from $$\Delta L_{c1}=L_1-L_1', \Delta S_{c1}=S_1-S_1', \Delta L_{c2}=L_2-L_2', \Delta S_{c2}=S_2-S_2' \quad (1)$$

Where, $L_1$, $L_2$ indicate a pattern width; $S_1$, $S_2$ indicate a space between the patterns; $L_1'$, $L_2'$ indicate a pattern width on a wafer; $S_1'$, $S_2'$ indicate a space between the patterns on the wafer.

In the layout compaction step 3, the input layout pattern 1 and the compaction condition generated in the compaction control step 2 are received as an input data. Then, the input layout pattern 1 is compacted in accordance with the compaction condition and a compacted layout pattern is retained. Hereinafter, the layout pattern after being compacted is referred to as compacted layout pattern.

In the optical proximity correction step 4, the compacted layout pattern compacted in the layout compaction step 3 and an optical proximity correction condition generated in the OPC condition generation step 8 are received as an input data. And in the layout compaction step 3, an optical proximity correction is made on the compacted layout pattern on which a compaction has been made.

Herein, a description will be made about the optical proximity correction condition. The optical proximity correction condition means, a condition for carrying out a deformation on the original layout pattern in order that a layout pattern is formed as an identical pattern on a wafer.

Figure 23A:
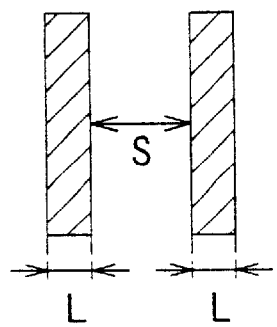
FIG. 23A and FIG. 23B are illustrations for illustrating the optical proximity effect correction condition.
Figure 23B:
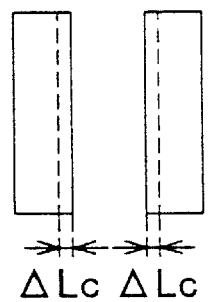

In case where the original layout pattern is, as shown in FIG. 23A, comprised of two rectangular patterns parallel with each other with width L and space S, the layout pattern after deformation becomes that, as shown in FIG. 23B, the width is larger than the width L of the original pattern by ΔLc at the inside therefore. As a result, the space S becomes narrower by 2×ΔLc.

In this case, depending on the value of the space S, the value of the ΔLc becomes, for example, as described below:

$$0 \leq S < 260 \text{ nm}, \Delta L_c = 20 \text{ nm}$$
$$260 \text{ nm} \leq S < 540 \text{ nm } \Delta L_c = 10 \text{ nm} \quad (2)$$
$$540 \text{ nm} \leq S < 1400 \text{ nm}, \Delta L_c = 0 \text{ nm}$$

Figure 24A:
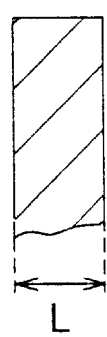
FIG. 24A and FIG. 24B are illustrations for illustrating the optical proximity effect correction condition.
Figure 24B:
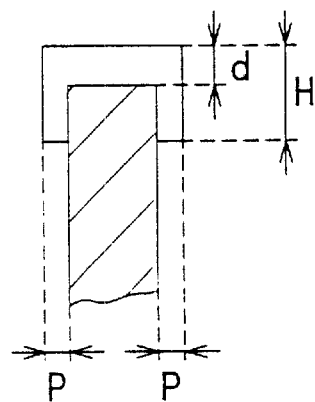

Whereas, in case where the original layout pattern is, as shown in FIG. 24A, comprised of a single rectangular pattern with width L, the layout pattern after deformation becomes that, as shown in FIG. 24B, the front end thereof is made wider and longer than the original pattern. In this case, depending on the value of the width L, the value d of the dimension becomes, for example, as shown below:

$$0 \leq L < 200 \text{ nm}, d=30 \text{ nm}$$
$$200 \text{ nm} \leq L < 400 \text{ nm } d=20 \text{ nm} \quad (3)$$
$$400 \text{ nm} \leq L < 800 \text{ nm}, d=10 \text{ nm}$$

Where, P=40 nm, H=200 nm; fixed without depending on the value of width L.

In the corrected layout pattern retention step 5, a data of the optical proximity corrected layout pattern generated in the optical proximity correction step 4 is retained. Hereinafter, the optical proximity corrected layout pattern will be referred to as corrected layout pattern.

In the first verification step 6, the input layout pattern 1 and the compacted layout pattern are received as input data. And then, a comparison and verification of the conjunctional relationship and the electrical characteristic of both layout patterns are carried out to verify that the compacted layout pattern performs a proper circuit operation. In case where any problem is detected, a first error data is outputted.

In the second verification step 10, the compacted layout pattern and the corrected layout pattern are received as input data. And then, a lithography simulation of semiconductor integrated circuit manufacturing process is made on the corrected layout pattern and a comparison and verification that the finish pattern on a silicon wafer is substantially the same as the compacted layout pattern are carried out to verify the corrected layout pattern is appropriate. In case where any problem is detected a second error data is outputted.

In the error data retention step 7, error data detected in the first and second verification steps 6, 10 are retained the data are outputted to the compaction control step 2.

In the OPC condition generation step 8, the input layout pattern 1 and the optical proximity effect information 9 are received as an input data. And an optimum optical proximity correction condition taking account of the compaction condition generated in the compaction control step 2 is generated.

Herein, a description will be made what optical proximity correction condition is generated based on the input layout pattern 1; the optical proximity effect information 9 and the compaction condition.

Figure 25:
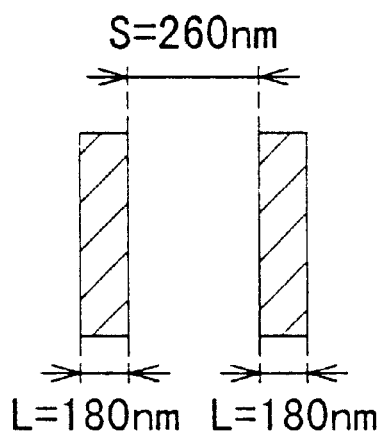
FIG. 25 is an illustration of rectangular patterns disposed parallel with each other.
Figure 26:
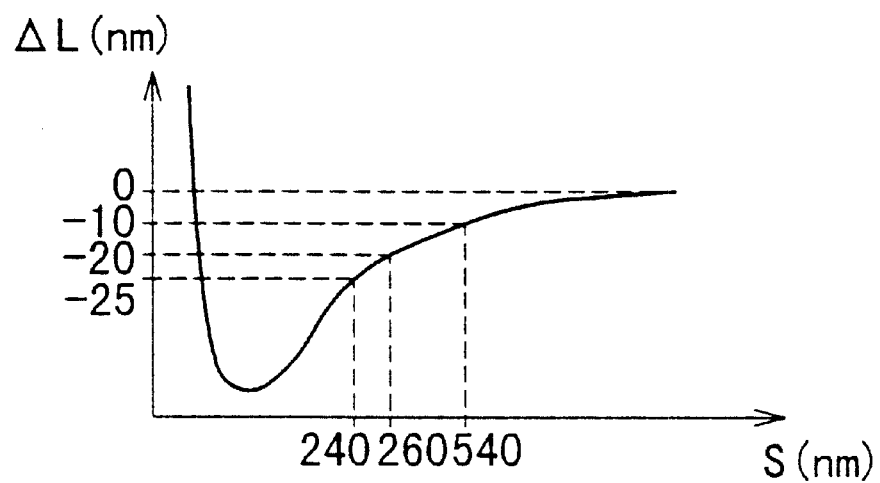
FIG. 26 is a graph showing a relationship between a layout pattern space and dispersion of the pattern width on a wafer.
Figure 27:
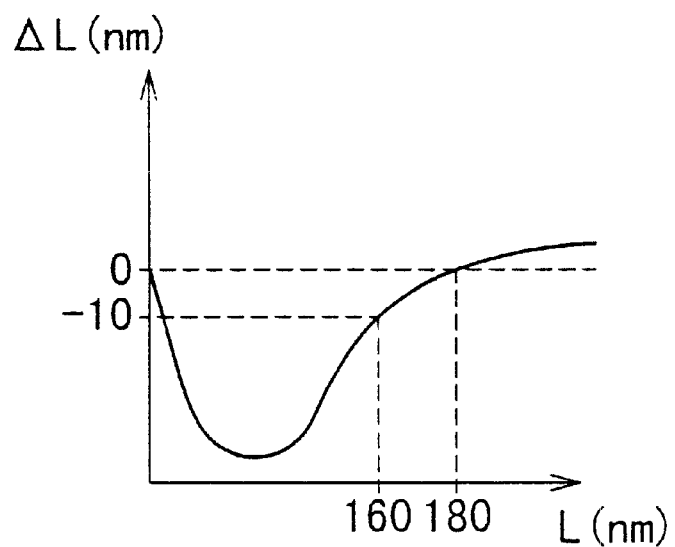
FIG. 27 is a graph showing a relationship between a layout pattern space and the pattern width on a wafer.

For example, a consideration will be made about a case where two rectangular patterns are disposed parallel with each other, and the space S is 260 nm and the width L is 180 nm as shown in FIG. 25. Assuming that the condition are the same as those described in FIG. 23A, FIG. 23B, FIG. 24A and FIG. 24B, the relationship between the space S and the dispersion ΔL of the width L on a wafer is as shown in FIG. 26. Also, the relationship between the width L of a pattern and the dispersion ΔL of the width L of the pattern on a wafer is as shown in FIG. 27.

Figure 28:
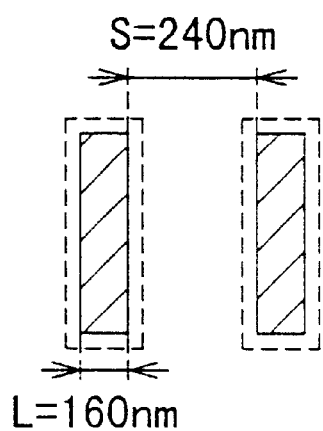
FIG. 28 is an illustration showing a corrected pattern.

For example, assuming that the compaction condition is equal for every pattern:

$$\Delta L_c = -10 \text{ nm}, \Delta S_c = -20 \text{ nm} \quad (4)$$

the pattern is deformed as shown in FIG. 28 based on the optical proximity effect information 9. That is:

$$S = 260 - 20 = 240 \text{ nm},$$

$$L = 180 - 10 \times 2 = 160 \text{ nm}.$$

Herein, a description will be made below about the difference in the compaction condition due to the difference between the width L and the space S.

In case where $0 \leq L < 180$ nm, $$0 \leq S < 240 \text{ nm}, \Delta L_c = +35 \text{ nm}$$

$$240 \text{ nm} \leq S < 260 \text{ nm}, \Delta L_c = +30 \text{ nm}$$

$$260 \text{ nm} \leq S < 540 \text{ nm}, \Delta L_c = +20 \text{ nm} \quad (5)$$

$$540 \text{ nm} \leq S < 1400 \text{ nm}, \Delta L_c = +10 \text{ nm}$$

In case where $180 \leq L$ $$0 \leq S < 240 \text{ nm}, \Delta L_c = +25 \text{ nm}$$

$$240 \text{ nm} \leq S < 260 \text{ nm}, \Delta L_c = +20 \text{ nm}$$

$$260 \text{ nm} \leq S < 540 \text{ nm} \Delta L_c = +10 \text{ nm} \quad (6)$$

$$540 \text{ nm} \leq S < 1400 \text{ nm}, \Delta L_c = 0 \text{ nm}$$

By virtue of the structure as described above, the layout compaction is carried out. Referring to the flowcharts, the processing steps of the layout compaction will be described. FIG. 2 is a flowchart showing the processing steps of the method of layout compaction. The process is initiated from a status the input layout pattern 1 and the optical proximity effect information 9 is given to the structure shown in FIG. 1.

Step 121: The input layout pattern 1, the optical proximity effect information 9 and a pattern retained in the error data retention step 7 are inputted to the compaction control step 2, a compaction condition appropriate to the inputted input layout pattern 1 is generated in the compaction control step 2.

Step 122: In the layout compaction step 3, a compaction of the input layout pattern 1 is carried out in accordance with the compaction condition generated in the compaction control step 2.

Step 123: The compacted layout pattern obtained in the layout compaction step 3 is inputted to the first verification step 6 and an electrical circuit simulation is carried out in the aspect of the electrical characteristic to verify whether or not the compacted layout pattern performs operation properly as an electrical circuit same as the input layout pattern 1. The verification of this time is carried out by means of comparison with the input layout pattern 1.

Step 124: In case where the result of operation verification is acceptable, the compressed layout pattern is transferred to the optical proximity correction step 4. In case where the result of operation verification is not acceptable, the layout pattern from which a problem occurs is extracted, the process proceeds to the step 128.

Step 128: In the error data retention step 7, an error data is retained in the error database and the process returns to the compaction control step 2, the above-mentioned step are repeated.

Step 125: The compacted layout pattern is inputted to the optical proximity correction step 4 and an optical proximity correction is carried out.

Step 126: A corrected layout pattern on which an optical proximity correction is made is inputted to the second verification step 10 and a lithography simulation and a process simulation are carried out to simulate the pattern to be formed on a silicon wafer and the finish pattern to be produced is verified. The verification is made by means of comparison with the compacted layout pattern.

Step 127: In case where the finish pattern, i.e., the corrected layout pattern has no problem, the flow of the process comes to end. In case where any problem is detected in the finish pattern, the layout pattern that has a problem is extracted and the flow of the process returns to the 128.

Step 128: In the error data retention step 7, the error data is retained in the error database, the process returns to the compaction control step 2 and a control is carried out so that the above-mentioned steps are repeated.

Figure 3A:
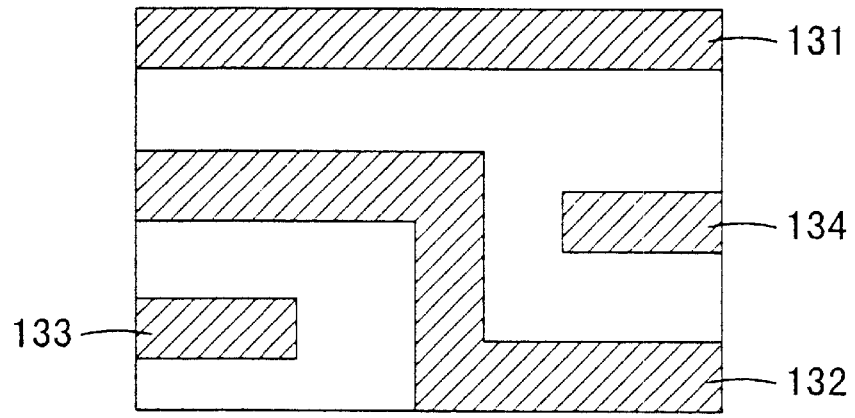
FIG. 3A, FIG. 3B and FIG. 3C are illustrations showing an example of changes in a pattern according to the first embodiment.
Figure 3B:
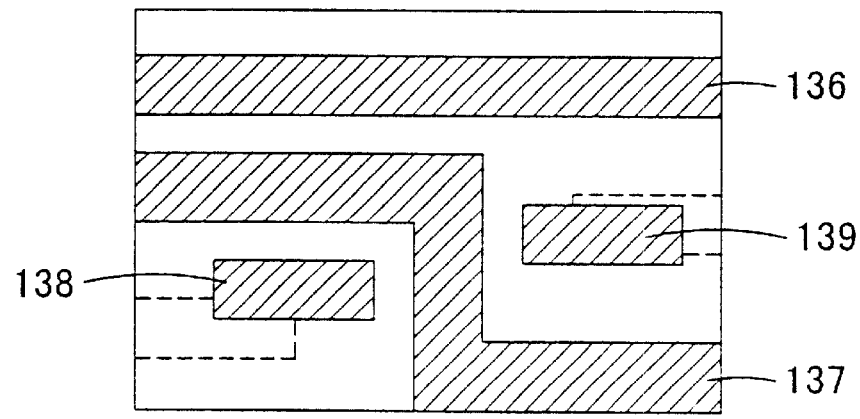
Figure 3C:
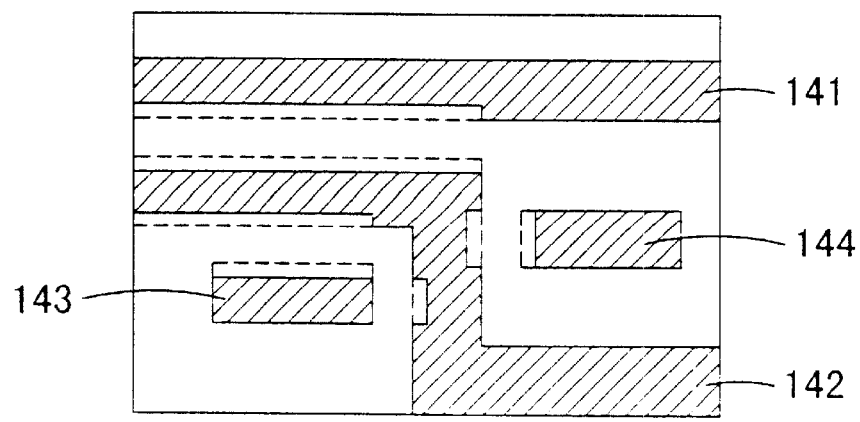

Next, using a concrete circuit, an example will be given. FIG. 3A, FIG. 3B and FIG. 3C are illustrations showing an example of changes in a pattern according to the first embodiment. The layout patterns 131–134 in FIG. 3A show layout patterns, which have been designed beforehand. The compacted layout patterns 136–139 in FIG. 3B show the compacted circuit layout patterns of the layout patterns 131–134. The corrected layout patterns 141–144 in FIG. 3C show corrected and compacted circuit layout patterns that an optical proximity correction is made on the compacted layout patterns 136–139.

In the embodiment of the invention, to determine a compaction condition, an example of compaction is given in which the layout pattern 132 in FIG. 3A is used as a reference. It is also possible to generate a different compaction condition using a desired layout pattern as a reference. Further, a plurality of desired layout patterns may be used as references.

According to the embodiment of the invention, under a condition in which the influence of the optical proximity effect also is taken account of, a compaction of layout pattern can be carried out, and it is made possible to reduce the area smaller than a compaction condition restricted by a process standard. Further, by carrying out a compaction while comparing the electrical characteristic between an initial layout pattern and a compacted layout pattern using a simulation, little difference is resulted in between the electrical characteristic of the initial layout pattern and the electrical characteristic after carrying out a layout compaction. As a result, it is made possible to provide a circuit structure that having a desired electrical characteristic by means of a layout pattern having a smaller area.

Furthermore, a layout compaction is made while verifying that an optical proximity corrected layout pattern is properly formed by obtaining a finish pattern to be formed on a wafer by the optical proximity corrected layout pattern by means of a simulation and by comparing the compacted layout pattern and the finish pattern. By virtue of this, it is made possible to generate a compaction condition for carrying out layout compaction process optimized to the manufacturing condition of a semiconductor integrated circuit device.

Second Embodiment

Next, referring to FIG. 4–FIG. 8, a description will be made about a second embodiment of the invention. The embodiment of the invention is to provide the control method of compaction in a manner where the optical proximity effect is also fully taken account.

Figure 4:
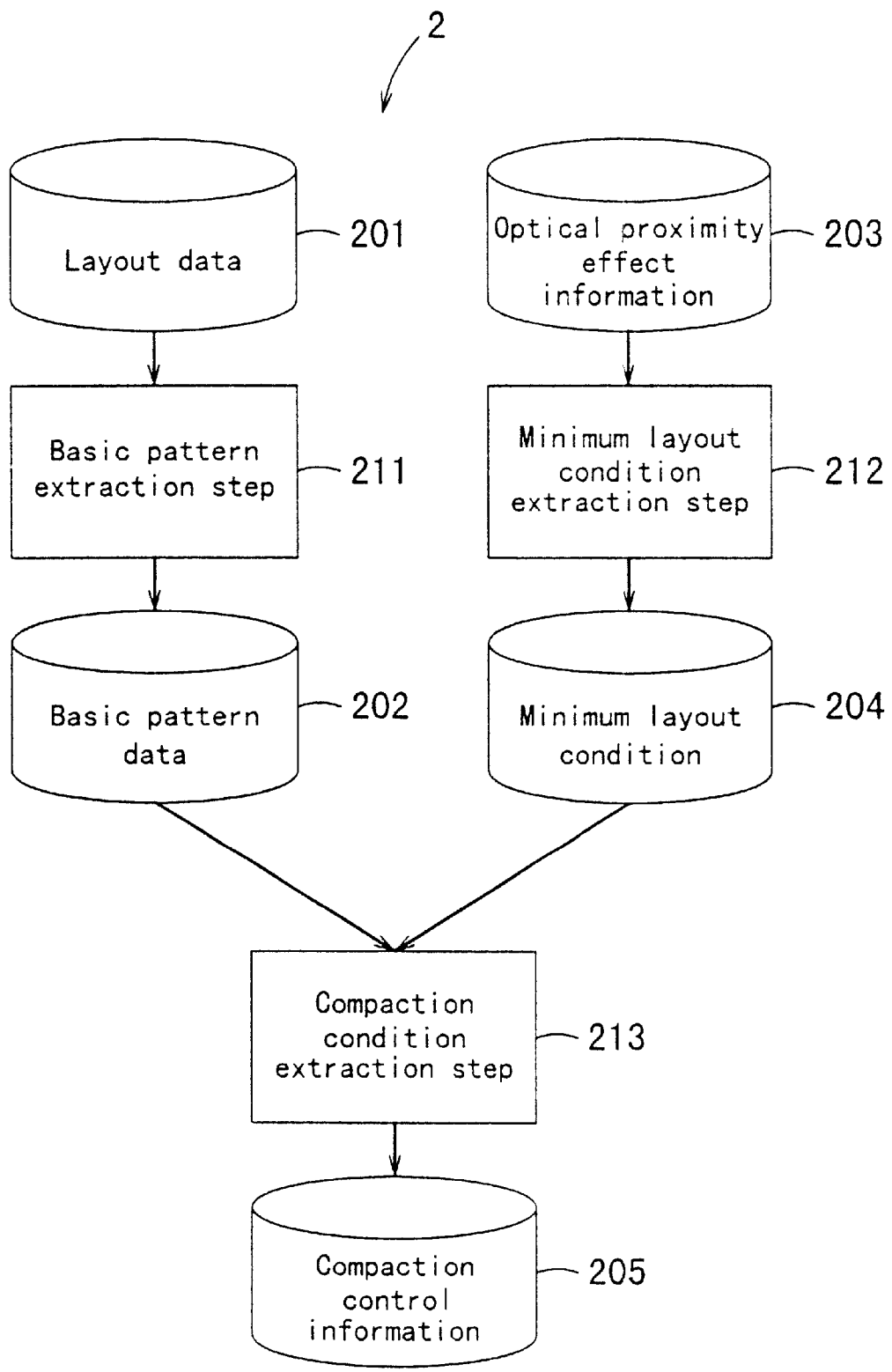
FIG. 4 is a block diagram showing an outline of a first example of the compaction control step 2 in FIG. 1 as a second embodiment.

FIG. 4 is a block diagram showing an outline of a first example of the compaction control step 2 in FIG. 1.

A layout data 201 is inputted to a basic pattern extraction step 211, and in the basic pattern extraction step 211, a basic pattern data 202 is extracted from the layout data 201.

Optical proximity effect information 203 is inputted to a minimum layout condition extraction step 212, and a minimum layout condition 204 is outputted by the minimum layout condition extraction step 212.

In a first compaction condition extraction step 213, the basic pattern data 202 and the minimum layout condition 204 are inputted and compaction control information 205 comprised of a set of compaction conditions is outputted. The compaction condition is generated to each basic pattern data 202.

Figure 33A:
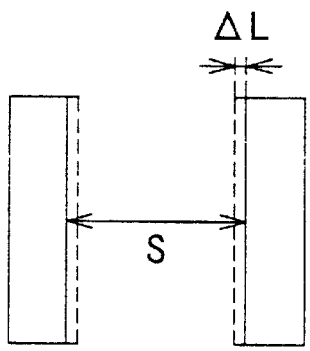
FIG. 33A is an illustration showing a rectangular layout pattern of a rectangle.
Figure 33B:
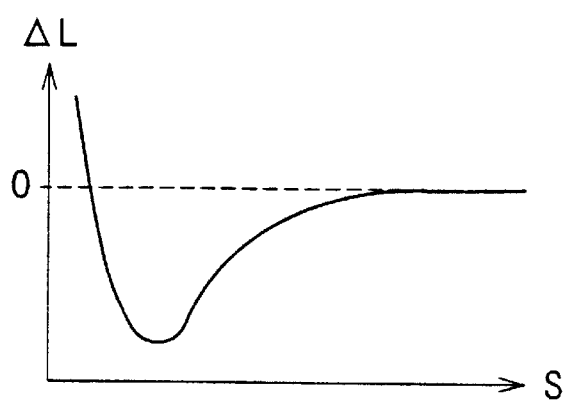
FIG. 33B is a graph showing a relationship between a layout pattern space and amount of change in the width of the layout pattern.

Herein, a description will be made about the minimum layout condition. FIG. 33A shows two rectangular patterns disposed parallel with each other. The space S between the two patterns and the dispersion ΔL of the pattern width have a relation ship as shown in FIG. 33B. In case of S<2×ΔL, the neighboring two patterns will come in contact with each other. Therefore, S>2×ΔL is the producible condition.

Figure 34:
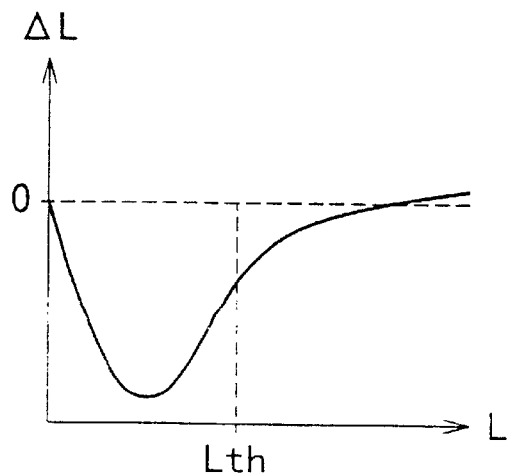
FIG. 34 is a graph showing a relationship between a layout pattern width and the pattern width on a wafer.

Further, the relationship between the width L of a layout pattern and the dispersion ΔL of the pattern width L on a wafer is as shown in FIG. 34. In case where the width L is two small, there may be a case where the pattern is not formed on a wafer, and the limit thereof is Lth and is the minimum width.

Furthermore, for compaction, two conditions are given, i.e., the pattern space S has to be made smaller and the pattern width L has to be made smaller. These two conditions have to fulfill the above-mentioned requirements i.e., the minimum space and the minimum width.

By virtue of the structure as described above, it is made possible to generate a producible compaction condition in which the optical proximity is taken account of.

Figure 5:
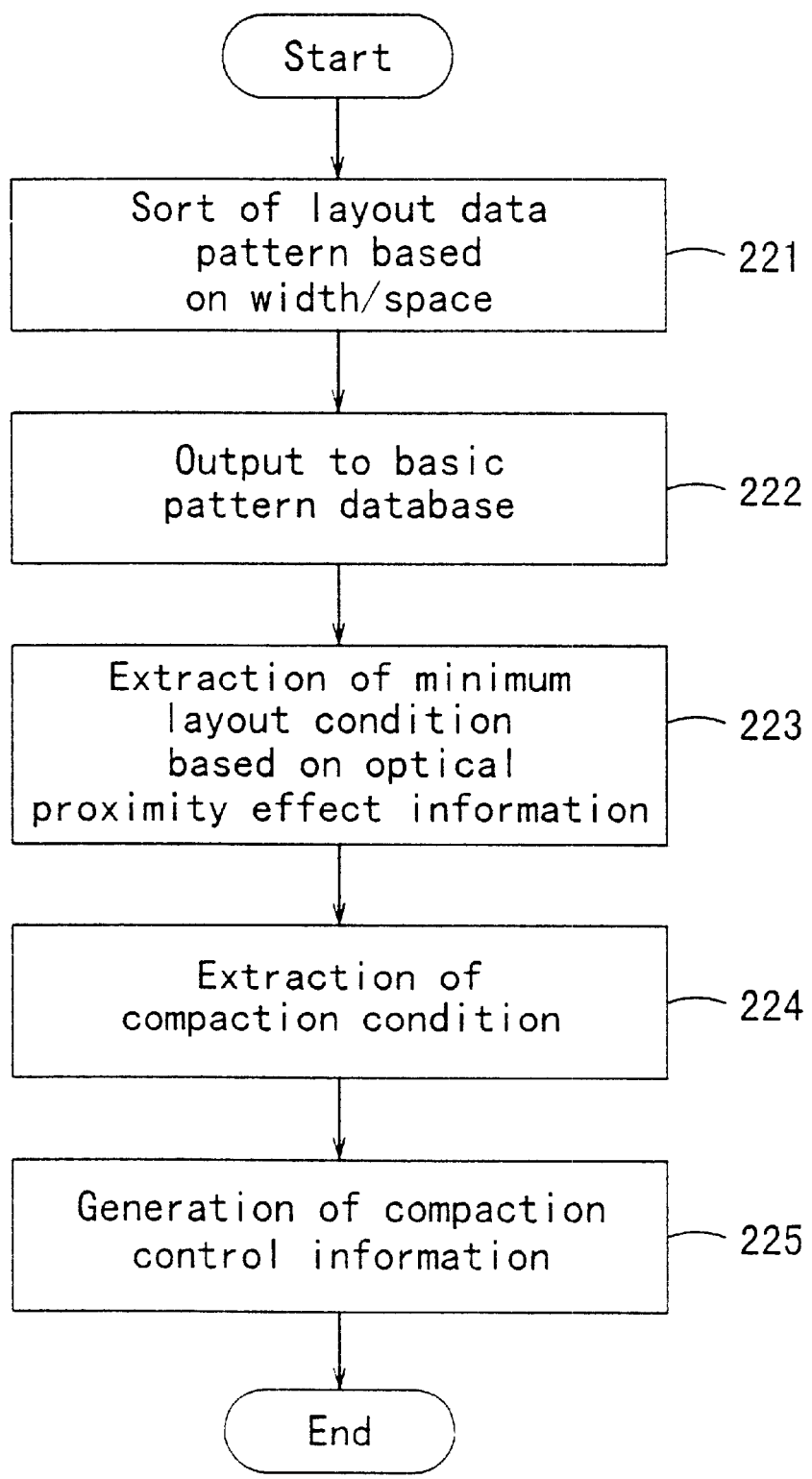
FIG. 5 is a flowchart showing the processing steps the a first example in the compaction control step 2.

Next, referring to the flowchart, a description will be made about the processing steps. FIG. 5 is a flowchart showing the processing steps of the first example in the compaction control step 2. The process is initiated from a status that the layout data 201 and the optical proximity effect information 203 are given to the structure shown in FIG. 4.

In a step 221, a basic pattern is extracted from the layout data 201, and is sorted on the basis of the width/space of the basic pattern. The basic pattern is comprised of a set of a random polygonal pattern and a space sandwiched by the random polygonal pattern and the neighboring pattern. A group of basic patterns extracted from the layout data 201 are outputted to the basic pattern database as the basic pattern data 202 in step 222. This process is carried out in the basic pattern extraction step 211.

In step 223, a producible minimum pattern information i.e., information of the width and space is extracted from the optical proximity effect information 203. The extracted information is outputted as the minimum layout condition 204. This process is carried out in the minimum layout condition extraction step 212.

In step 224, respective compaction condition is generated to each basic pattern included in the basic pattern data 202 from the minimum layout condition 204, and is outputted as the compaction control information 205 in step 225. This process is carried out in the compaction condition extraction step 213.

Figure 6:
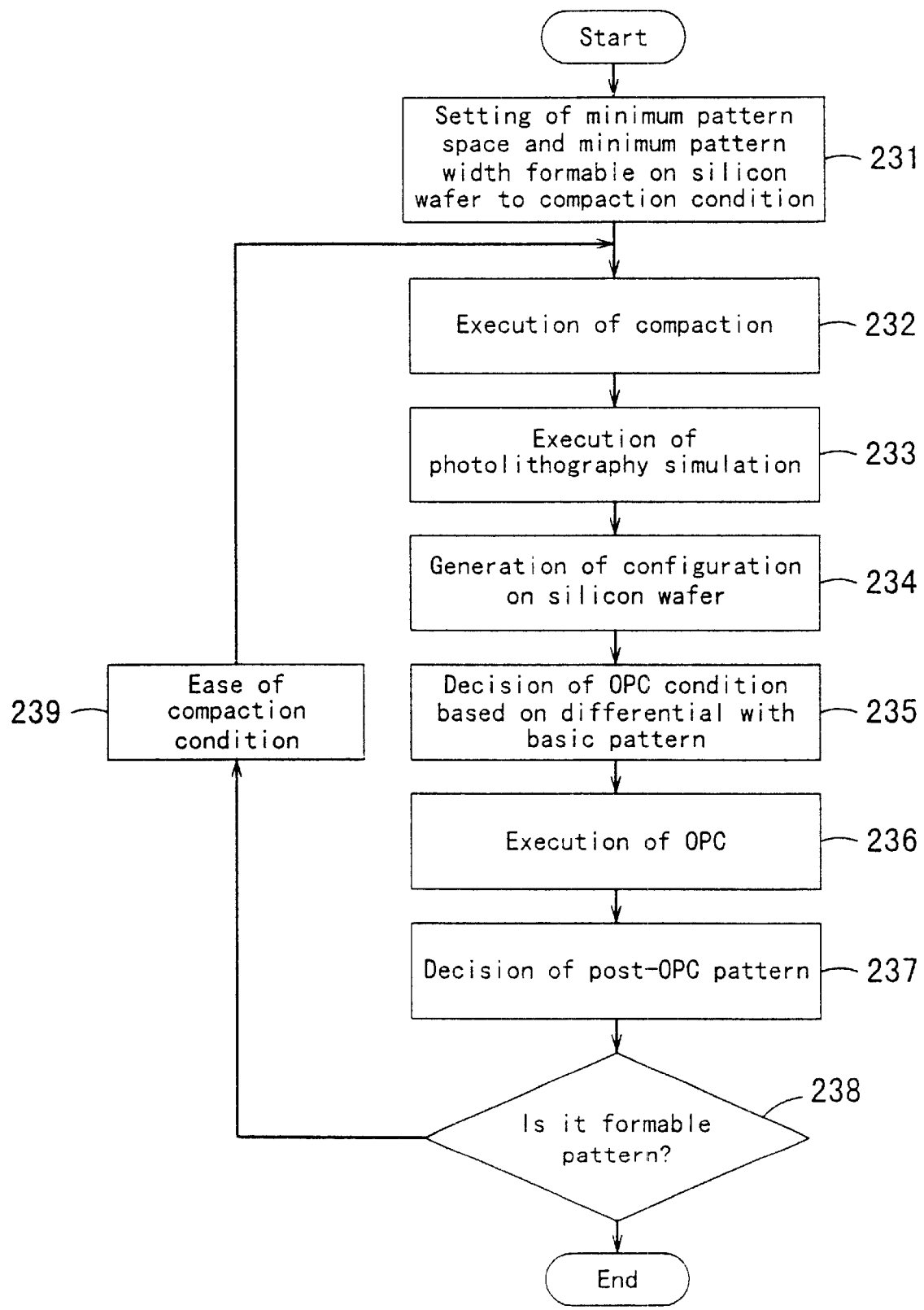
FIG. 6 is a flowchart showing the processing steps of the compaction condition extraction step 213.

FIG. 6 is a flowchart showing the processing steps in compaction condition extraction step 213 shown in FIG. 4. This process is initiated from a state in which the minimum layout condition 204 and the basic pattern data 202 are given thereto.

In step 231, a producible minimum pattern space and minimum pattern width presented by the minimum layout condition 204 are set in the compaction condition.

In step 232, a compaction is carried out on the basic pattern data 202 under the compaction condition, which is set beforehand.

In step 233, a lithography simulation is carried out on the compacted basic pattern data. In step 234, a pattern to be formed on a silicon wafer is generated.

In step 235, a differential between the pattern generated by the lithography simulation and the basic pattern data 202 is extracted. An OPC condition is decided based on the extracted differential pattern.

To describe the same concretely, the OPC condition is set by altering the basic pattern by an amount of the differential pattern adversely to the differential pattern. To describe the same more concretely, in case where the difference pattern is outside of the basic pattern, the basic pattern is subtracted by a part thereof, i.e., by a part of the differential pattern. In case where the difference pattern is inside of the basic pattern, the basic pattern is added with a part thereof, i.e., by a part of the differential pattern. Thus, the OPC condition is set.

Figure 29A:
FIG. 29A, FIG. 29B, and FIG. 29C are illustrations showing a basic pattern and a generated pattern by means of simulation, and a differential pattern between them respectively.
Figure 29B:
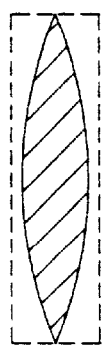
Figure 29C:

For example, assuming that, as a result of a lithography simulation carried out on a basic pattern shown in FIG. 29A, a resultant pattern is generated as shown in FIG. 29B. In this case, the differential pattern between the basic pattern and the generated pattern is resulted as shown in FIG. 29C; the same resides inside of the basic pattern.

Figure 30A:
FIG. 30A, FIG. 30B, FIG. 30C and FIG. 30D are illustrations showing deformation of basic patterns.
Figure 30A:
Figure 30B:
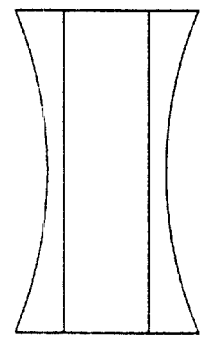
Figure 30C:
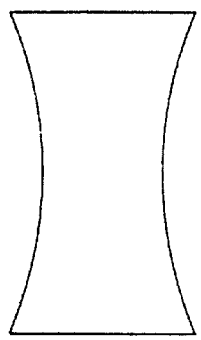
Figure 30D:
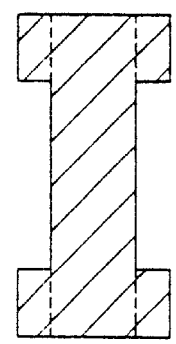

In a case like this, the basic pattern is deformed as described below. That is to say, in a case where there are a basic pattern and a differential pattern as shown in FIG. 30A, by turning over a part of the differential pattern and then by adding the same to the basic pattern, a pattern shown in FIG. 30C is obtained. And by carrying out linear approximitation, a pattern shown in FIG. 30D is obtained.

Figure 31A:
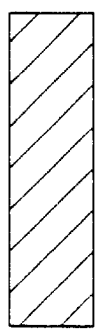
FIG. 31A, FIG. 31B, and FIG. 31C are illustrations showing a basic pattern, a generated pattern by means of simulation and a differential pattern between them respectively.
Figure 31B:
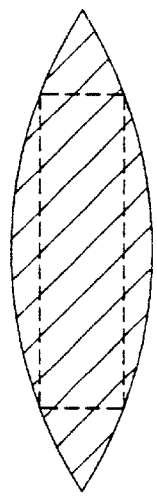
Figure 31C:
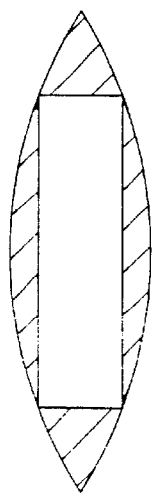

Whereas, assuming that, as a result of a lithography simulation carried out on a basic pattern as shown in FIG. 31A, a resultant pattern is generated as shown in FIG. 31B. In this case, the differential pattern between the basic pattern and the generated pattern is resulted as shown in FIG. 31C; the same resides outside of the basic pattern.

Figure 32A:
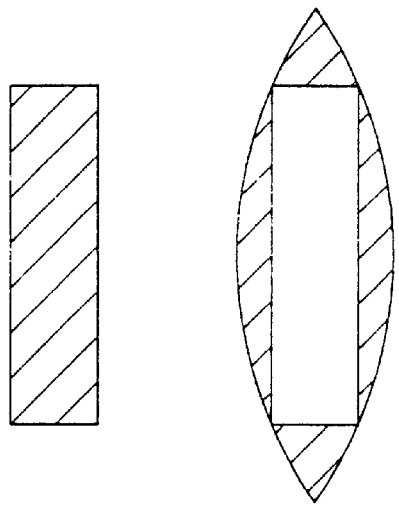
FIG. 32A, FIG. 32B, FIG. 32C and FIG. 32D are illustrations showing deformations of basic patterns.
Figure 32B:
Figure 32C:
Figure 32D:
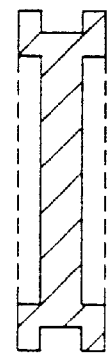

In a case like this, the basic pattern is deformed as described below. That is to say, in case where there are a basic pattern and a differential pattern as shown in FIG. 32A, by turning the part exceeding over the basic pattern and by subtracting the same from the basic pattern as shown in FIG. 32B, a resultant pattern as shown in FIG. 32C is obtained. And then, by carrying out linear approximitation, a pattern as shown in FIG. 32D is obtained.

In step 236, an OPC process is carried out on the basic pattern data 202 based on the decided OPC condition. In step 237, a pattern configuration after carrying out the OPC process is decided and OPC processed data is outputted.

In step 238, a judgment is made whether or not the OPC processed basic pattern data has a producible pattern. To describe the same concretely, it is exactly same as the description made in FIG. 33A, FIG. 33B and FIG. 34.

In case where, as a result of the judgment, it is a producible pattern, a compaction condition and on OPC condition are outputted respectively and the process comes to end.

Whereas, in case where, as a result of judgment, it is not a producible pattern, in step 239, the initial compaction condition is made easier, and the compaction process is carried out again.

Figure 7A:
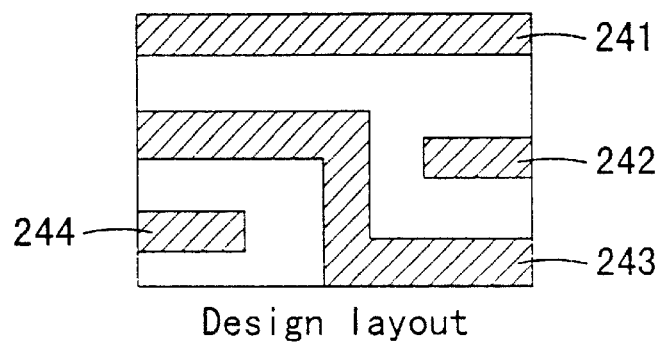
FIG. 7A, FIG. 7B and FIG. 7C are illustrations showing examples of patterns of the compaction control step.
Figure 7B:
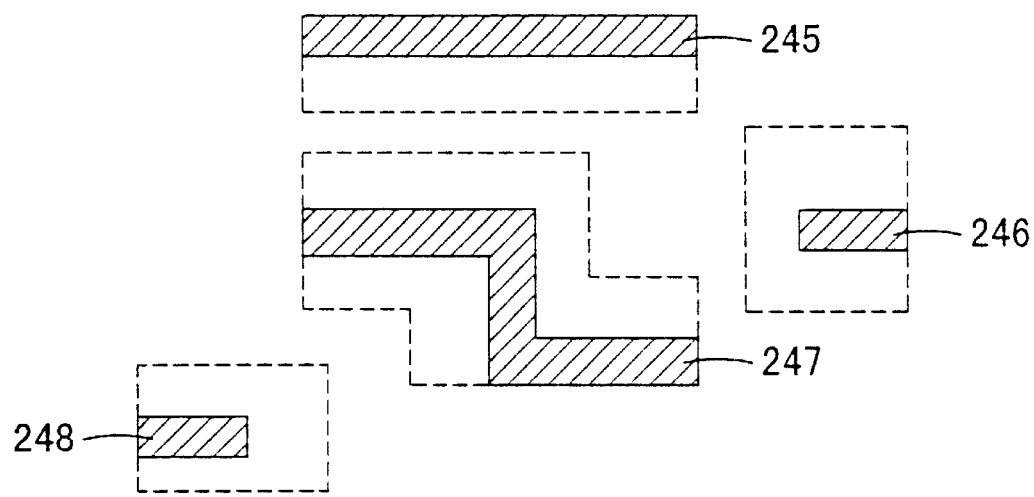
Figure 7C:
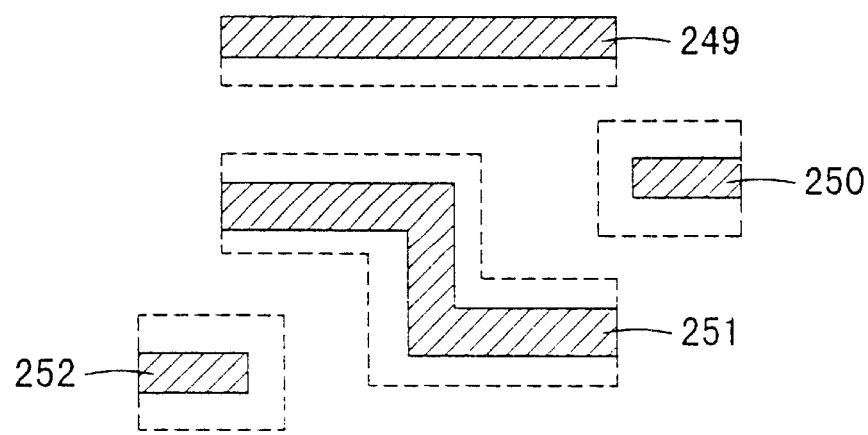

Next, using a concrete circuit pattern, a description will be made about the basic pattern extraction step 211. FIG. 7A, FIG. 7B and FIG. 7C are illustrations showing a first example of the first verification step 6.

FIG. 7A is an illustration showing an input pattern. Reference numerals 241–244 denote respective layout patterns.

Layout patterns 241–244 are resolved into the basic patterns 245–248 shown in FIG. 7B respectively, as a set of a random polygonal pattern and the spaces sandwiched by the random polygonal pattern and the other neighboring polygonal patterns. To the basic patterns 245–248, in accordance with the respective basic pattern, a compaction condition for compacting the area only is set respectively. In case where the respective compaction condition is applied to the basic patterns 245–248, the basic patterns 245–248 are compacted, for example, as the patterns 249–252 shown in FIG. 7C.

Information tabled based on each compaction condition is outputted as compaction control information.

Figure 8:
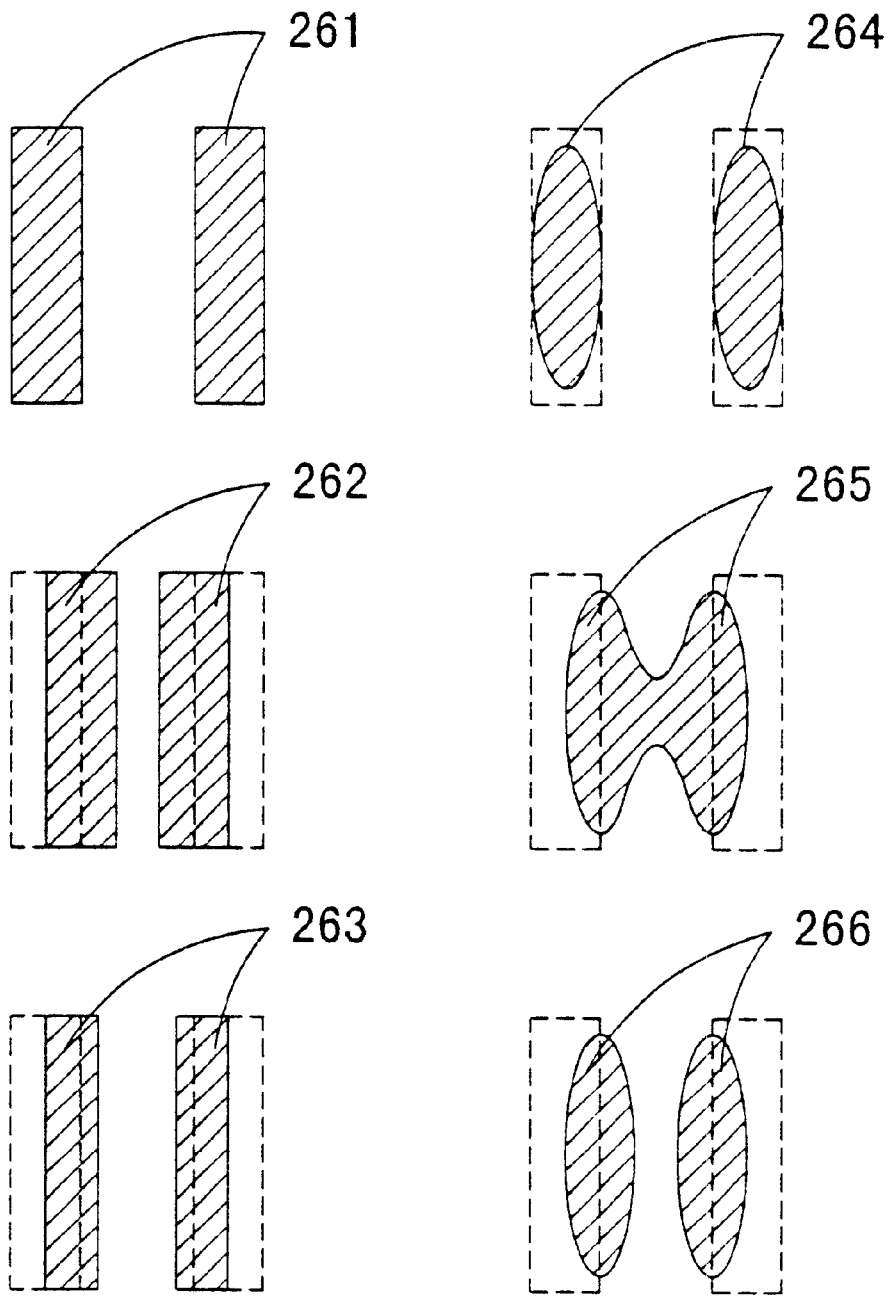
FIG. 8 is an illustration showing a relationship between compaction and OPC.

FIG. 8 is an illustration showing a relationship between the compaction and the OPC. Reference numeral 261 denotes a layout pattern; reference numeral 262 denotes a compacted layout pattern; reference numeral 263 a pattern that is carried out an OPC process on the compacted layout data. Further, reference numerals 264–266 denote the patterns 261–263 in case where they are formed on a silicon wafer, respectively.

First, the basic patterns 261 are formed with a configuration like patterns 264 on a silicon wafer. The patterns 264 have no problem in the aspect of configuration and electrical circuit.

Next, the basic patterns 262 are formed on a silicon wafer with the light and left patterns being in contacted with each other like the patterns 265. This is caused as a result that the space between the patterns 262 become narrower due to a compaction process, the optical proximity effect appears more remarkably.

Next, the basic patterns 263 are formed properly like the pattern 266 on a silicon wafer. The optical proximity effect due to a compaction is offset by the OPC and the same is prevented from appearing remarkably.

Figure 9:
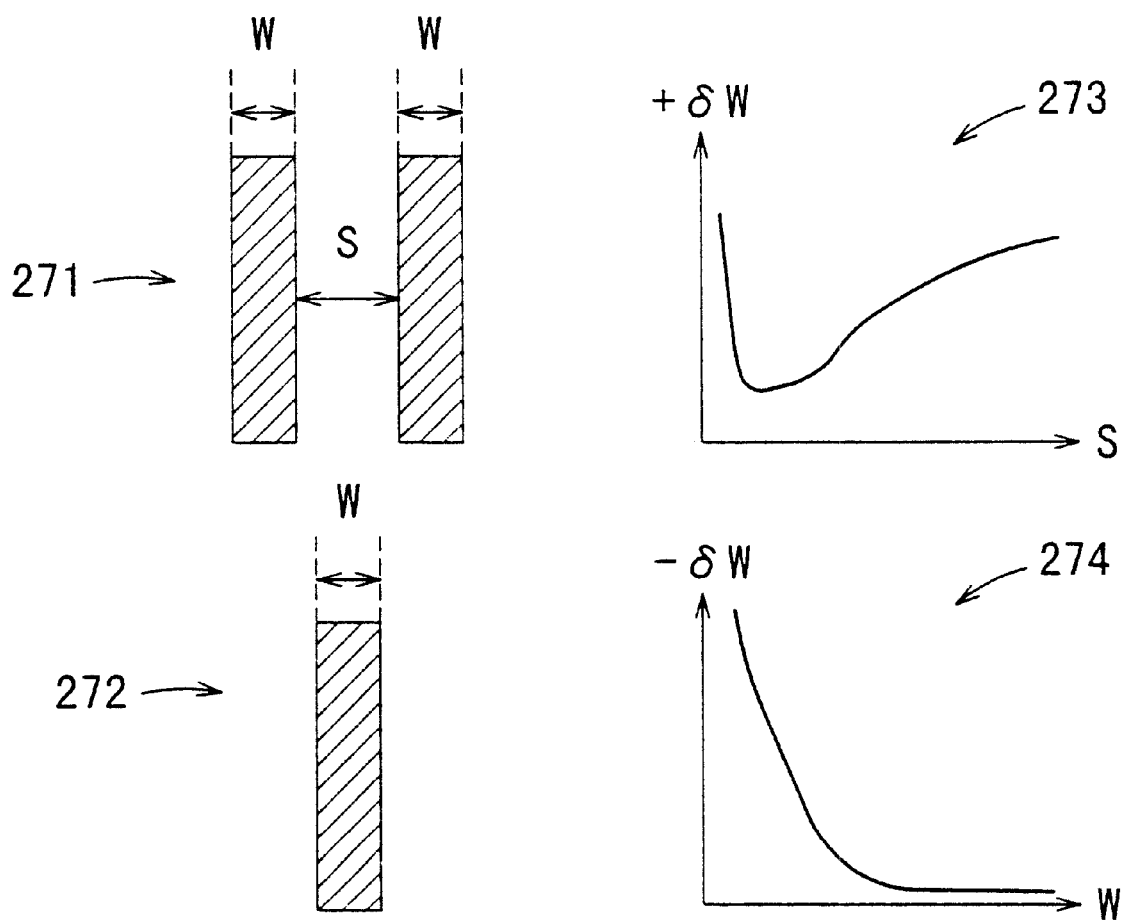
FIG. 9 is a illustration showing the concept of the minimum layout condition extraction step 212 in which the minimum layout condition 204 is outputted from the optical proximity effect information 203.

FIG. 9 is an illustration showing the concept of the minimum layout condition extraction step 212 in which the minimum layout condition 204 is outputted from the optical proximity effect information 203. Reference numeral 271 denotes two rectangular patterns disposed parallel with each other; reference numeral 272 denotes a single rectangular pattern.

Further, reference numeral 273 denotes a graph that is obtained by measuring deformation of a pattern due to optical proximity effect on the pattern 271. Reference numeral 274 denotes a graph that is obtained by measuring deformation of a pattern due to optical proximity effect on the pattern 272. In the graphs 273, 274 in FIG. 9, reference symbol S denotes pattern space; reference symbol W denotes pattern width; reference symbol +δW, −δW denote fluctuation of pattern width, i.e., dispersion. The graph 273 shows a fact that when pattern space S varies, finished pattern width on a wafer varies. Also, the graph 274 shows a fact that when pattern width W varies, finished pattern width on a wafer varies.

A relationship between the width of a pattern formed on a silicon wafer and a space between the pattern and neighboring pattern is represented by a graph or table. And the data of this graph or table is retained. Also, a relationship between the width of a pattern formed on a silicon wafer and the width of the layout pattern is represented by a graph or table. And the data of this graph or table is retained. These data are the optical proximity effect information.

From the optical proximity effect information, the width of a minimum layout pattern producible on a silicon wafer can be extracted, and also the space of a minimum layout pattern producible on a silicon wafer can be extracted.

In case where the pattern space becomes smaller, the pattern width on a wafer becomes larger. In case where the pattern space is set too small, the neighboring patterns come in contact with each other. The limit where they do not come in contact with each other is the minimum space. Also, in case where the pattern width becomes smaller, the finish becomes thinner. In case where the width is set too small, the pattern may not be formed. The limit where the pattern can be formed is the minimum width. These can be detected from the graphs in FIG. 9.

The pattern image to be formed on a silicon wafer can be generated by carrying out photolithography simulation on each basic pattern. An OPC condition is decided based on a differential between the pattern image and the basic pattern.

Whereas, in an embodiment of the invention, the above-mentioned example is given as an example of method of compaction control. However, it is also possible that a process condition wherein the optical proximity effect is not taken account of is applied to the compaction control information. In this case, although the area compacted by the compaction process is small, but total processing time is reduced.

According to this embodiment, in addition to the first embodiment, by calculating the minimum dimension of a layout pattern producible based on an optical proximity effect information, and by setting the lower limit value of the compaction, it is made possible to generate a compaction condition wherein the optical proximity effect is taken account of. Further, by resolving the layout pattern to be compacted into a plurality basic patterns, it is made possible to set respective compaction condition to each basic pattern and a highly effective compaction is provided.

Third Embodiment

Referring to FIG. 10, FIG. 11, FIG. 12A and FIG. 12B, a description will be made about a third embodiment of the invention. This embodiment carries out the method of compaction verification limiting the same to the layout variation.

Figure 10:
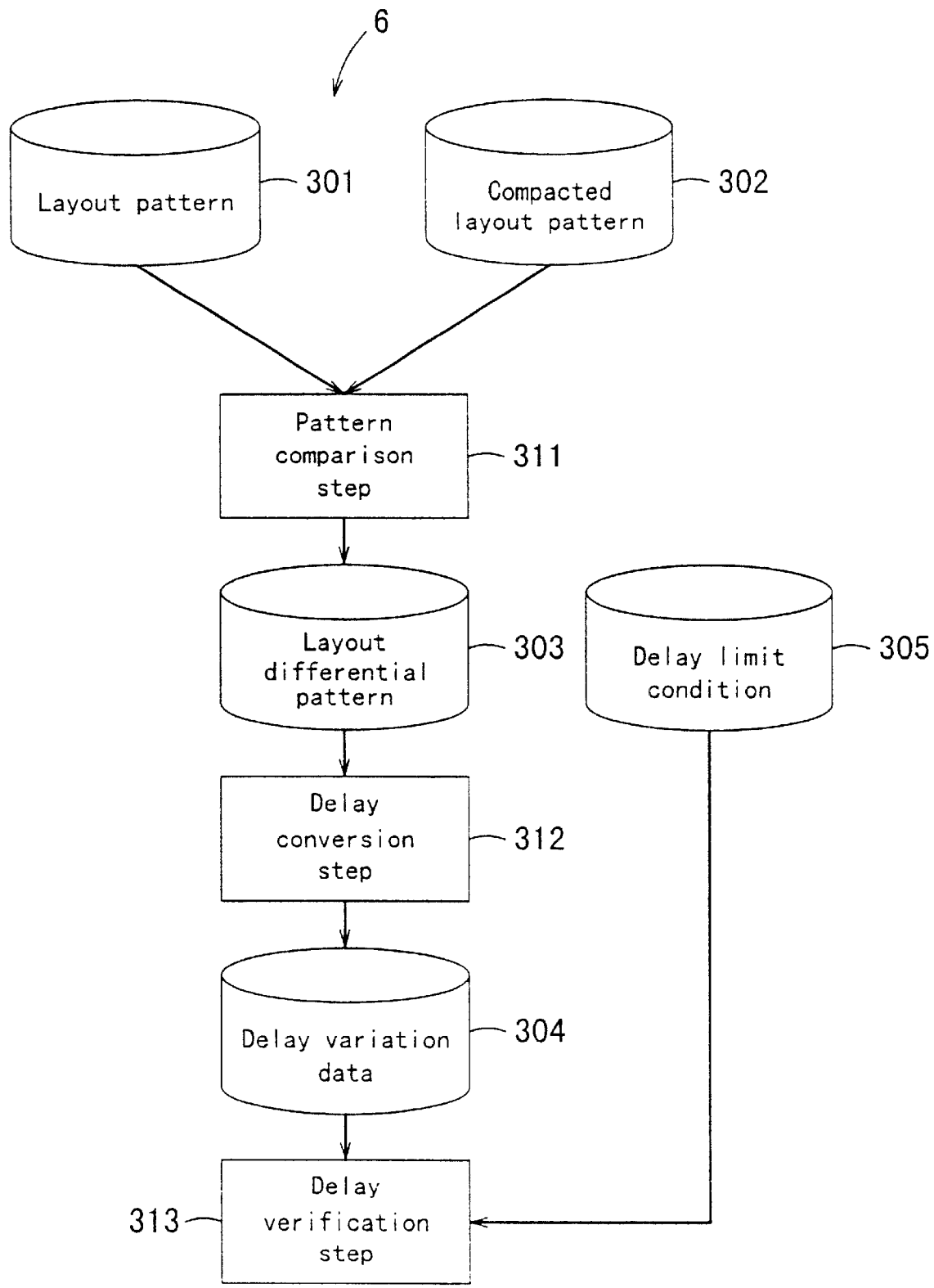
FIG. 10 is a block diagram showing an outline of the verification step 6 in FIG. 1 as a third embodiment.

FIG. 10 is a block diagram showing an outline of the first verification step 6 according to the first embodiment. A layout pattern (data) 301 and a compacted layout pattern (data) 302 are given as an input. In a pattern comparison step 311, a pattern comparison is carried out and a differential between them is outputted as a layout differential pattern (data) 303.

The layout differential pattern 303 is given as an input data, and by a delay conversion step 312, a value of parasitic capacity due to a layout variation is calculated based on the area and dimension of the layout differential pattern 303; further the same is converted into a delay value and outputted as a delay variation data 304.

The delay variation data 304 and a delay limit condition 305 are given as an input data, and by a delay verification step 313, a decision is made whether or not the delay variation data 304 is included within a allowable range of the delay limit condition 305, a verification is carried out for any problem in operation due to a delay variation.

By virtue of the structure as described above, it is made possible to carry out verification whether or not the layout pattern after compaction performs proper circuit operation.

Next, using a flowchart, a description will be made about processing steps thereof.

Figure 11:
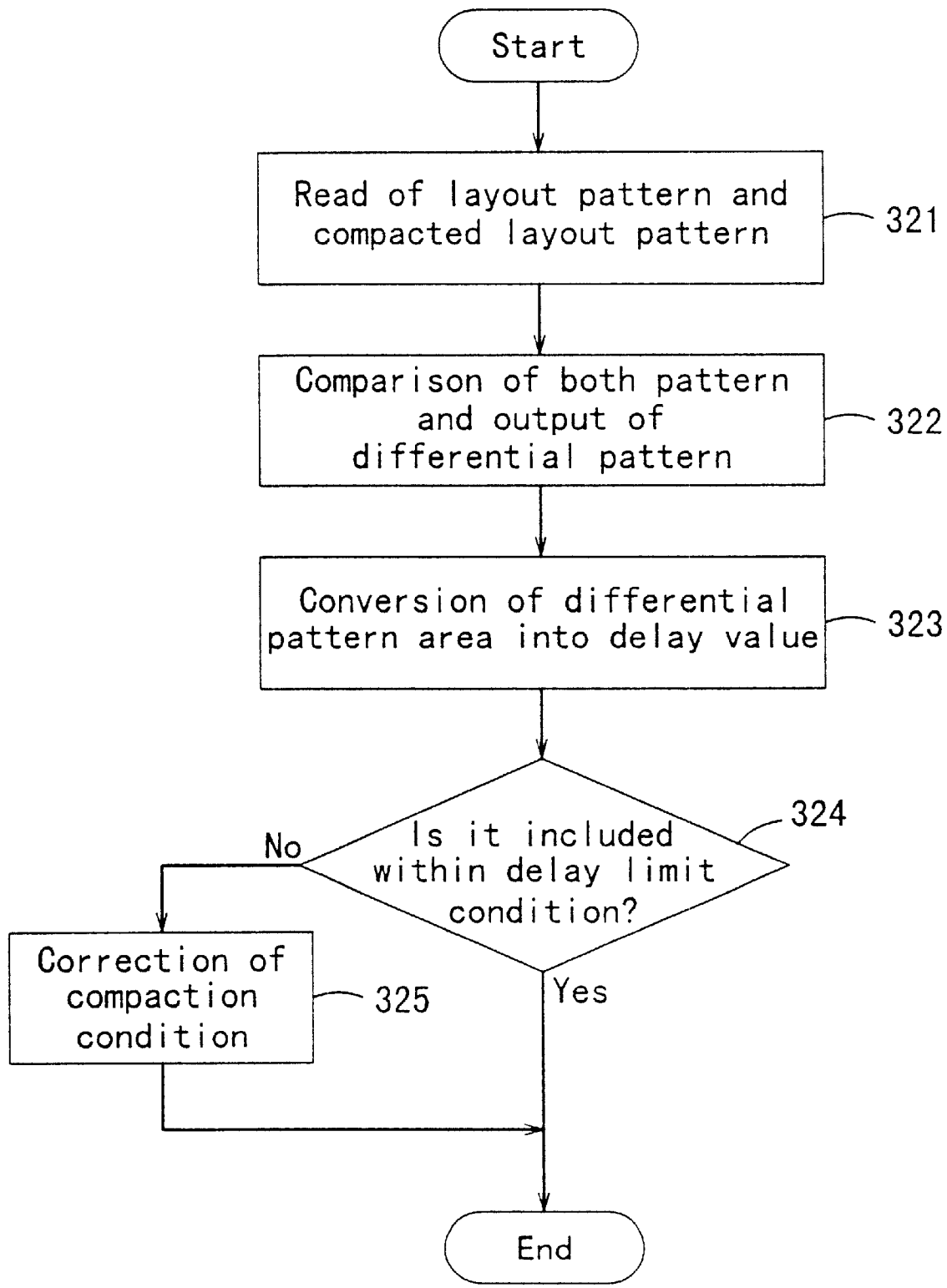
FIG. 11 is a flowchart showing the processing steps of the delay time verification step.

FIG. 11 is a flowchart showing a processing step of the first verification step 6. First, in step 321, the layout pattern (data) 301 and the compacted layout pattern (data) 302 are read.

In step 322, a differential pattern is calculated based on the layout pattern 301 and the compacted layout pattern 302, and the same is retained as the layout differential pattern (data) 303. This process is carried out in the pattern comparison step 311.

In step 323, the layout differential pattern 303 is given as on input data, and the layout differential pattern 303 is converted into a parasitic capacity value based on the area and dimension of each polygonal pattern included in the layout differential pattern 303.

Further, the parasitic capacity is converted into a delay value and outputted as the delay variation data 304.

In step 324, the delay variation data 304 and the delay limit condition 305 are given as an input data, and a decision is made whether or not the delay variation data 304 is included within allowable range of the delay limit condition 305. In case where the same is included within a range wherein no problem occurs in circuit operation thereof, the process comes to end. In case where any problem may occur in the operation, in step 325, a correction is made on the compaction condition and the step comes to end.

Figure 12A:
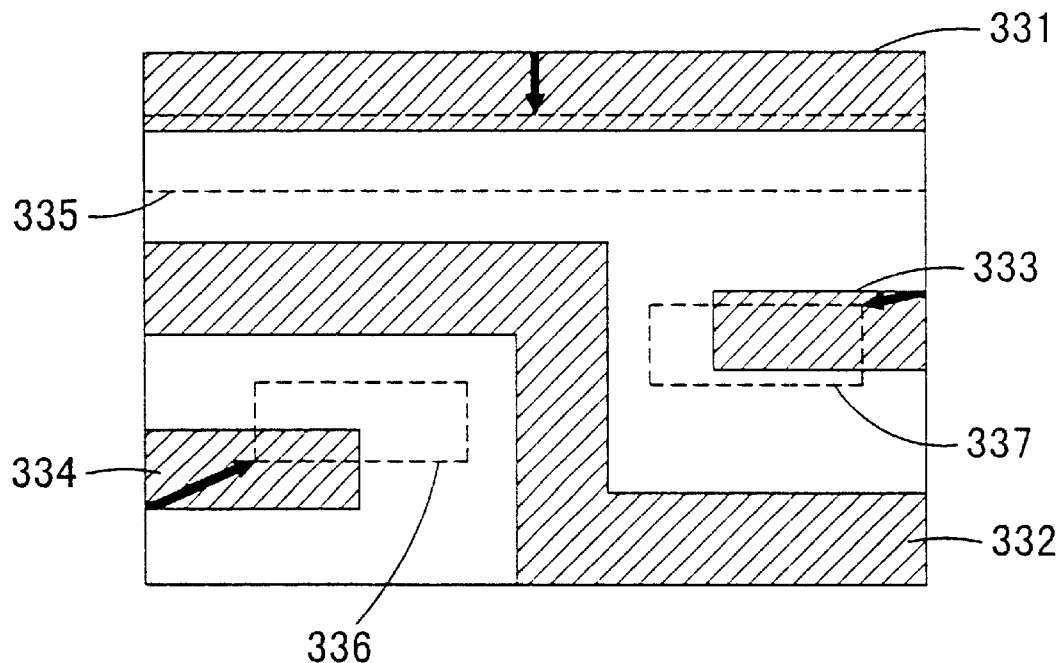
FIG. 12A and FIG. 12B are illustrations showing an example of changes in a pattern in the pattern comparison step 311.
Figure 12B:
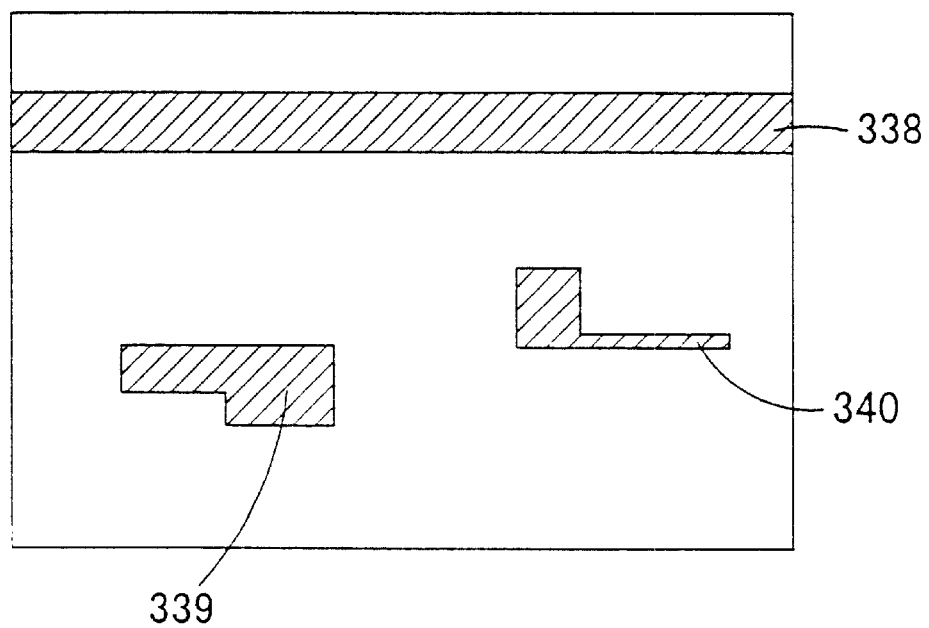

Next, referring to a concrete pattern, a description will be made about the pattern comparison step 311. FIG. 12A and FIG. 12B are illustrations showing an example of the pattern comparison step 311. A geometrical EXCLUSIVE-OR operation is carried out on layout patterns (data) 331–334 and compacted layout patterns (data) 335–337 shown in FIG. 12A, and layout differential patterns (data) 338–340 shown in FIG. 12B are extracted. The variation of capacity capacitor is calculated based on the width of the layout differential patterns 338–340, and then the same is converted into an amount of variation of the delay value.

According to this embodiment, in addition to the first embodiment, a parasitic capacity is calculated based on a differential layout pattern, and is converted into a delay value. And by carrying out a comparison a limit condition of the delay value indicating a limit value wherein no influence is given on circuit operation due to delay, it is made possible to carry out a high speed verification of circuit operation. Accordingly, it is not necessary to carry out a verification of circuit operation by extracting a parasitic amount from a compacted layout pattern and carrying out a simulation.

Forth Embodiment

Next, referring to FIG. 13, FIG. 14, FIG. 15A, FIG. 15B and FIG. 15C, a description will be made about a fourth embodiment of the invention. This embodiment provides a method of compaction control in which the delay time is fully taken account of.

Figure 13:
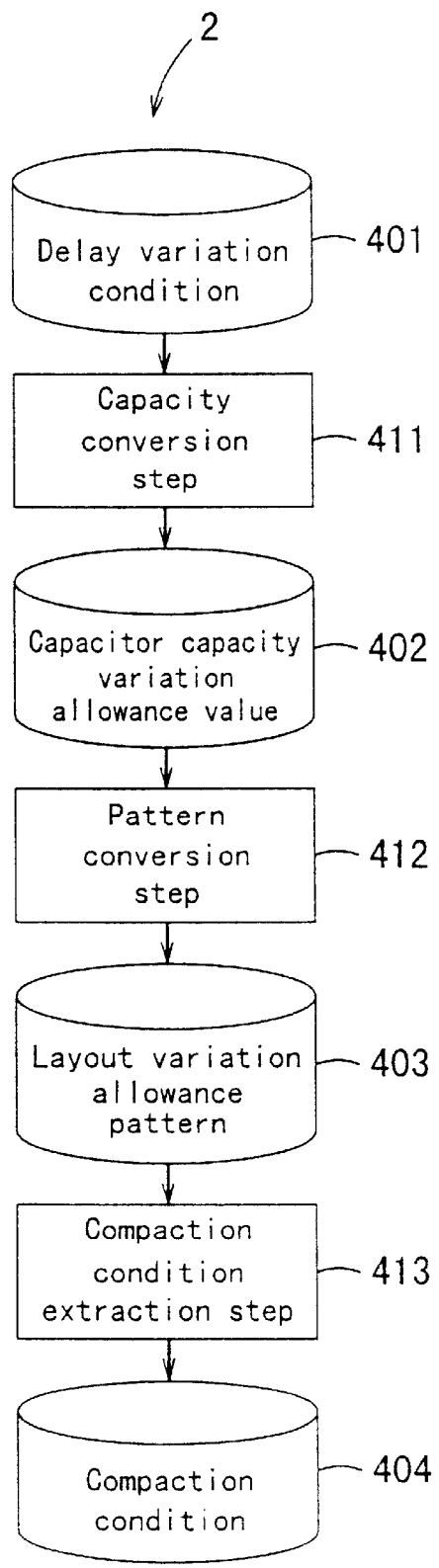
FIG. 13 is a block diagram showing an outline of a second example of the second compaction control step 2 in FIG. 1 as a fourth embodiment.

FIG. 13 is a block diagram showing an outline of a second example of the compaction control step 2 according to the first embodiment. In this example, a delay variation condition 401 that indicates a condition, wherein operation of an electric circuit is ensured even when the delay time varies, is inputted. And then, in a capacity conversion step 411, a delay time variation allowable value wherein the electric circuit of the input layout pattern is able to operate properly, i.e., the delay variation condition 401 is converted into a capacitor capacity variation allowable value, and a capacitor capacity variation allowance value 402 is outputted.

In a pattern conversion step 412, the capacitor capacity variation allowance value 402 is converted into a layout variation allowance pattern 403. In a second compaction condition extraction 413, the layout variation allowance pattern 403 is converted into a second compaction condition 404 in accordance with each pattern configuration.

By virtue of the structure as described above, it is made possible to generate a second compaction condition wherein the delay time is taken account of and under which an electrical circuit is able to operate.

Figure 14:
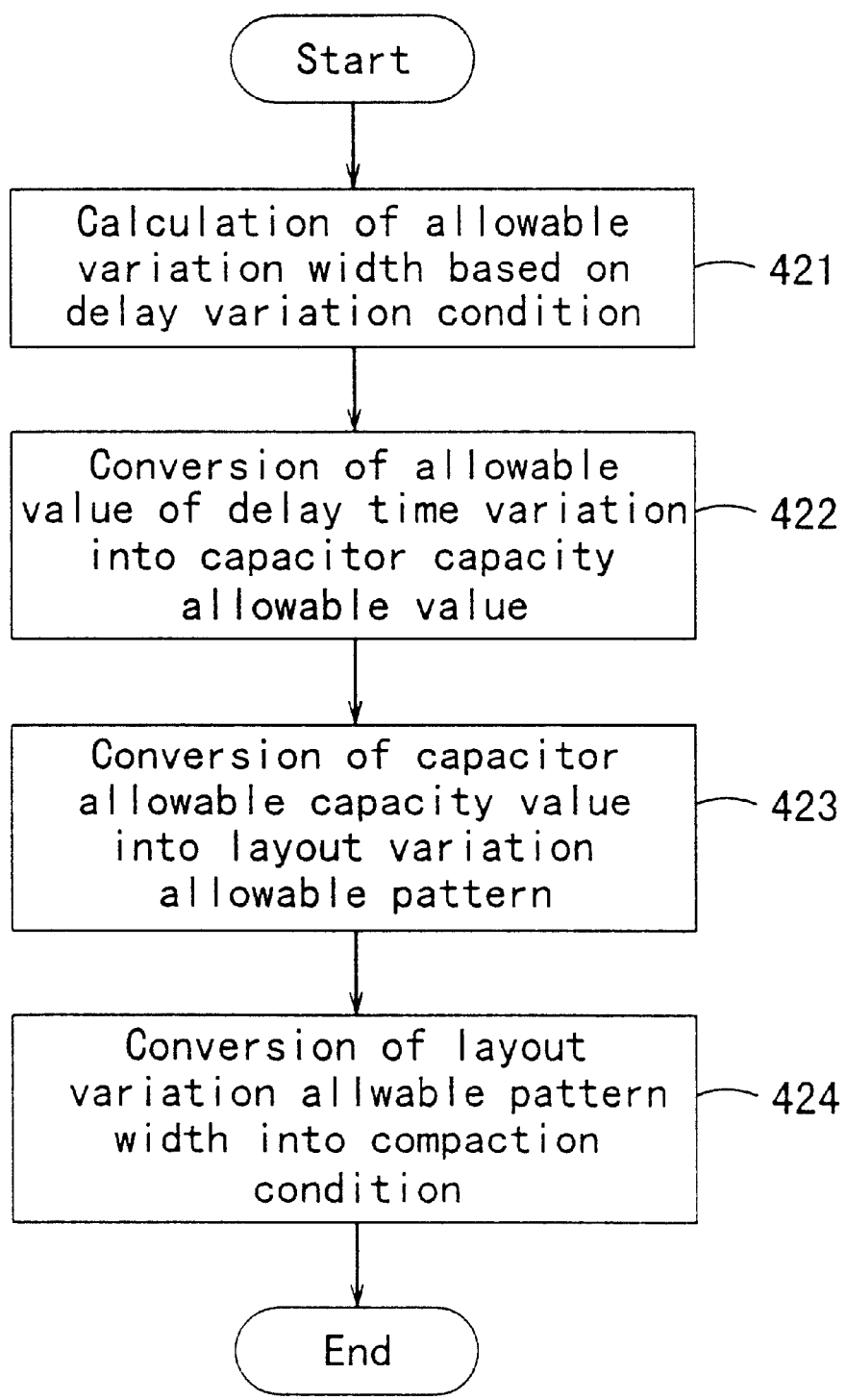
FIG. 14 is a flowchart showing the processing steps of the second example of the second compaction control step 2.

Next, referring to the flowchart in FIG. 14, a description will be made about the processing steps.

In step 421, the delay variation condition 401 is comprised of a table indicating the upper limit/standard value/lower limit, and each allowable variation range is calculated.

In step 422, the allowable range of the delay time variation is converted into a variation range of the capacitor capacity, and a capacitor capacity variation allowance value 402 is obtained.

In step 423, the capacitor capacity variation allowance value 402 is converted into the layout variation allowance pattern 403 in accordance with the configuration of the neighboring pattern.

In step 424, the width of the line of the layout variation allowance pattern 403 is detected and outputted a second compaction condition, and the process comes to end.

Figure 15A:
FIG. 15A, FIG. 15B, and FIG. 15C are illustrations showing an example of generation of layout variation allowable patterns.
Figure 15A:
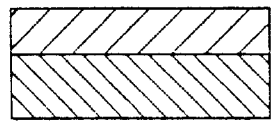
Figure 15B:
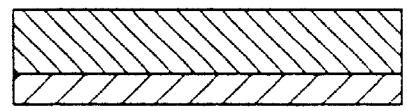
Figure 15B:
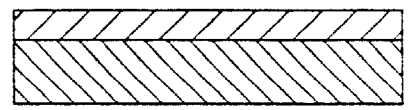
Figure 15C:
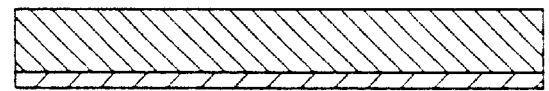
Figure 15C:
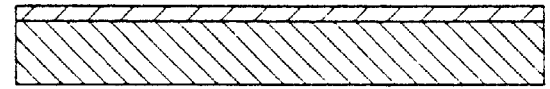

Next, using formulas and referring to FIG. 15A, FIG. 15B and FIG. 15C, a description is made about a concrete method. The delay variation condition 401 is a delay variation condition under which an electric circuit is operable properly, and {upper limit, standard value, lower limit} are represented as {tmax, tstd, tmin} respectively. The upper allowable variation value δta, and the lower allowable variation value δtb is calculated by:

$$\delta ta = tmax - tstd$$

$$\delta tb = tstd - tmin$$

Next, the relationship between a parasitic capacity Cp and a delay time tp is represented by a function as:

$$Cp = f(tp)$$

Herein, an upper limit value δCa and the capacitor variation value a lower limit value δCb are calculated as:

$$\delta Ca = f(\delta ta)$$

$$Cb = f(\delta tb)$$

Next, the upper limit value δCa and the lower limit value δCb of the capacitor variation value are converted into a layout variation allowable pattern. The layout variation allowable pattern is generated in accordance with the configuration of the neighboring pattern. In this case, as shown in FIG. 15A, FIG. 15B and FIG. 15C, the pattern is generated so that a specific area is always maintained.

Finally, the width of the generated layout variation allowance pattern is measured, and outputted as a second compaction condition.

According to this embodiment, in addition to the first embodiment, by directing the viewpoint to the variation of delay time in an electric circuit, the variation range of delay time, wherein operation of the electric circuit is ensured, is converted into capacitor capacity. The variation range of the capacitor capacity is represented as a differential pattern in the layout pattern. By virtue of this, it is made possible to decide a pattern variation due to a compaction and a compaction condition is set. Accordingly, a highly effective compaction is provided.

Fifth Embodiment

Figure 16:
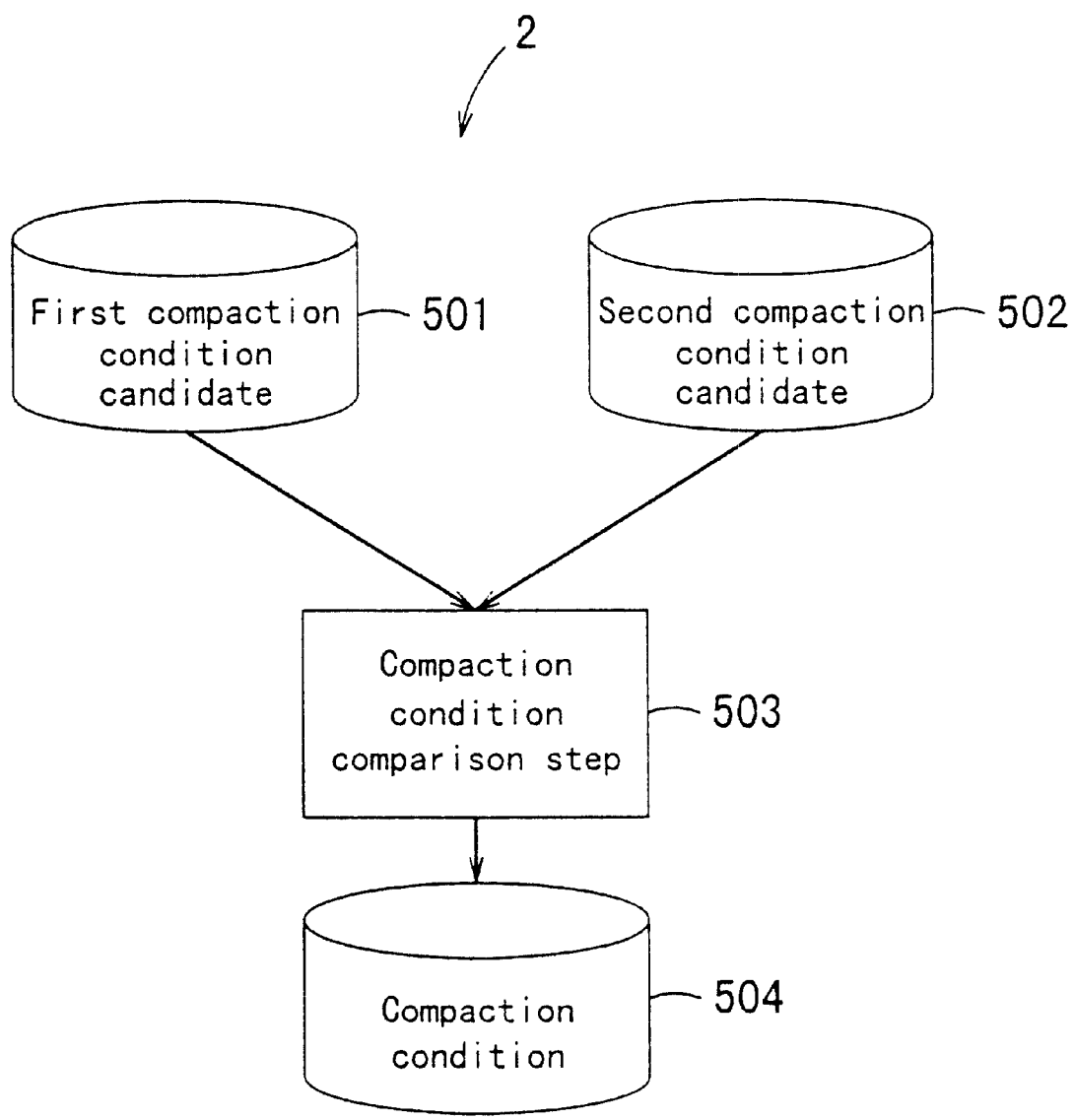
FIG. 16 is a block diagram showing an outline of a third example of the compaction control step 2 in FIG. 1 as a fifth embodiment.
Figure 17:
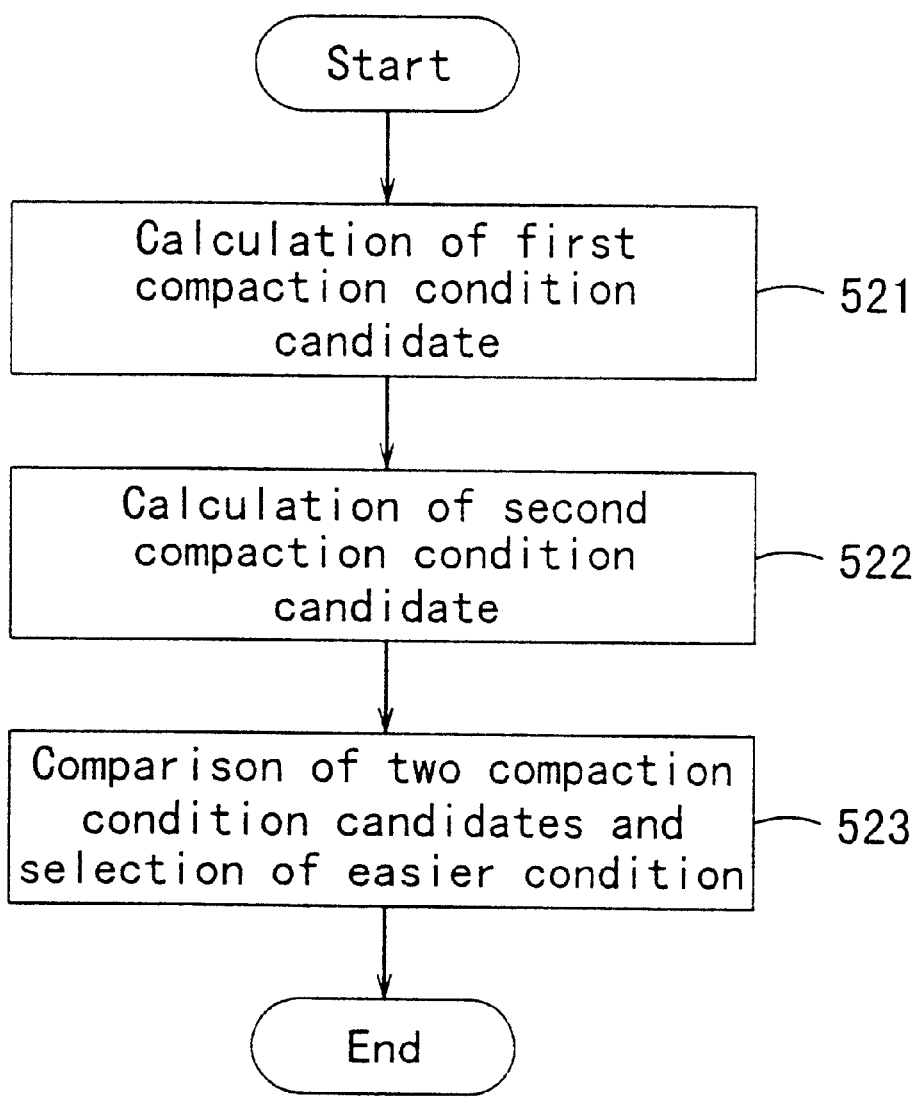
FIG. 17 is a flowchart showing the processing steps of the third example of the compaction control step 2.
Figure 18:
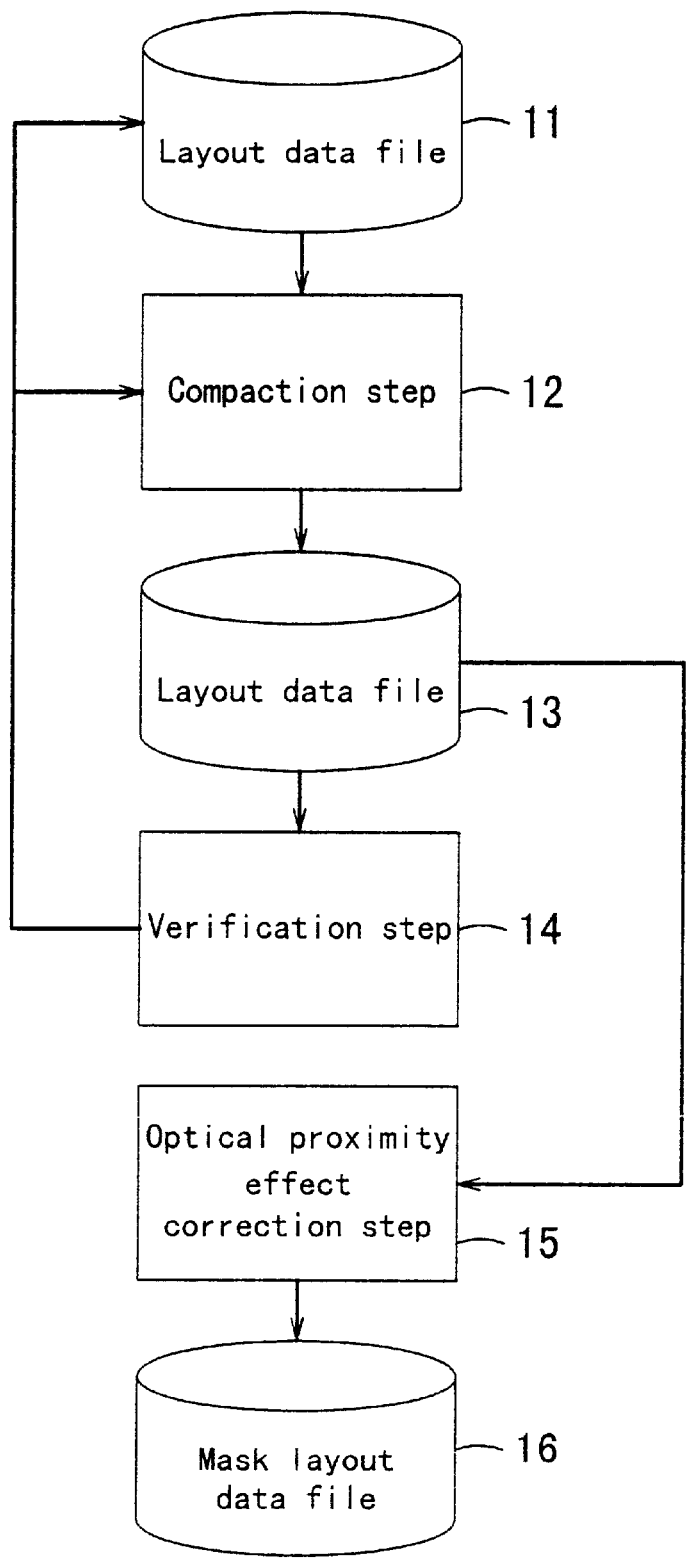
FIG. 18 is a flowchart showing a conventional manner wherein a layout data of a semiconductor integrated circuit is compacted and converted into a mask pattern.

Next, referring to FIG. 16–FIG. 17, a description will be made about a fifth embodiment of the invention. This embodiment provides a method of compaction control in which the optical proximity effect and the delay time are fully taken account of FIG. 16 is a block showing an outline of a third example of the compaction control step 2 according to the first embodiment. In this embodiment, reference numeral 501 denotes a first compaction condition candidate same as the compaction condition described in the second embodiment; reference numeral 502 denotes a second compaction condition candidate same as the compaction condition described in the fourth embodiment. Reference numeral 503 denotes a compaction condition comparison step in which a comparison is made between the first compaction condition candidate 501 and the second compaction condition candidate 502, and the easier one is selected as a compaction condition. Reference numeral 504 denotes a compaction condition selected in the compaction condition comparison step 503.

By virtue of the structure as described above, it is made possible to generate a compaction condition in which the optical proximity effect and the delay time are taken account of and under which an electric circuit is able to operate.

Next, referring to the flowchart in FIG. 17, a description will be made about the processing steps.

In step 521, a first compaction condition candidate is calculated by the first compaction control step described in the second embodiment.

In step 522, a second compaction condition candidate is calculated by the second compaction control step described in the fourth embodiment.

In step 523, a comparison is made between the first compaction condition candidate and the second compaction condition candidate, and the easier one is selected as a compaction condition and outputted.

According to this embodiment, by selecting a easier compaction condition candidate out of the compaction condition candidates generated by the second embodiment and the fourth embodiment, it is made possible to set a condition that is producible and ensures an electric circuit to operate properly as well as to reduce processing time of the entire layout compaction.

What is claimed is:

1. A method of layout compaction, comprising:
   a layout compaction step for compacting an input layout pattern based on a compaction condition and generating a compacted layout pattern;
   a first verification step for receiving the input layout pattern and the compacted layout pattern as data, verifying that the compacted layout pattern performs a proper circuit operation by comparing the input layout pattern and the compacted layout pattern, in case where any problem is detected, a first error data is outputted;
   an optical proximity correction step for carrying out an optical proximity correction based on an optical proximity correction condition on the compacted layout pattern and generating an optical proximity corrected layout pattern; and
   a second verification step for receiving the compacted layout pattern and the optical proximity corrected layout pattern as data, obtaining a finish pattern to be formed on a wafer by the optical proximity corrected layout pattern, and verifying that the optical proximity corrected layout pattern is properly formed by comparing the compacted layout pattern and the finish pattern, and in case where any problem is detected, outputting a second error data,
   wherein the generation of the compaction condition is controlled based on the first error data and the second error data.

2. The method of layout compaction as set forth in claim 1, comprising a compaction control step for generating a compaction condition appropriate to an input layout pattern,
   wherein the compaction control step includes a minimum layout condition extraction step for extracting a producible minimum layout condition based on the optical proximity effect information, a basic pattern extraction step for resolving the input layout pattern into a plurality of basic patterns and a compaction condition extraction step for generating the compaction condition based on the minimum layout condition extracted in the minimum layout condition extraction step and the plurality of basic patterns extracted in the basic pattern extraction step.

3. The method of layout compaction as set forth in claim 1 wherein the first verification step includes a pattern comparison step for extracting a differential pattern between the input layout pattern and the compacted layout pattern, a delay conversion step for calculating a capacitor capacity based on the differential pattern extracted in the pattern comparison step and converting the capacitor capacity into a delay value and a delay verification step for verifying for any operational failure due to a delay variation based on the delay value calculated in the delay conversion step.

4. The method of layout compaction as set forth in claim 1, comprising a compaction control step for generating a compaction condition appropriate to an input layout pattern,
wherein the compaction control step includes a capacity conversion step for converting a delay time variation allowance value in the input layout pattern into a capacitor capacity variation allowance value, a pattern conversion step for converting the capacitor capacity variation allowance value into a layout variation allowance pattern and a compaction condition extraction step for generating the compaction condition based on the layout variation allowance pattern obtained in the pattern conversion step.

5. The method of layout compaction as set forth in claim 1, comprising a compaction control step for generating a compaction condition appropriate to an input layout pattern,
wherein the compaction control step includes:
a minimum layout condition extraction step for extracting a producible minimum layout condition based on the optical proximity effect information;
a basic pattern extraction step for resolving the input layout pattern into a plurality of basic pattern;
a first compaction condition extraction step for generating a first compaction condition candidate based on the minimum layout condition extracted by the minimum layout condition extraction step and a plurality of basic patterns extracted by the basic pattern extraction step;
a capacity conversion step for converting a delay time variation allowance value in the input layout pattern into a capacitor capacity variation allowance values;
a pattern conversion step for converting the capacitor capacity variation allowance value into a layout variation allowance pattern;
a second compaction condition extraction step for generating a second compaction condition candidate based on the layout variation allowance pattern obtained by the pattern conversion step; and
a compaction condition selection step for selecting the easier compaction condition out of the first compaction condition candidate obtained by the first compaction condition extraction step and the second compaction condition candidate obtained by the second compaction condition extraction step.

6. The method of layout compaction as set forth in claim 1, comprising a compaction control step for generating a compaction condition appropriate to an input layout pattern,
wherein the compaction control step outputs the compaction condition as a data in which the width of a layout pattern and the space between the neighboring layout patterns are coupled.

7. The method of layout compaction as set forth in claim 1 wherein the compaction condition is updated based on the results of the first and second verification stage.

* * * * *